US012681386B2

(12) United States Patent
Komori et al.

(10) Patent No.: US 12,681,386 B2
(45) Date of Patent: Jul. 14, 2026

(54) PHOTOSENSITIVE RESIN COMPOSITION, DRY FILM, PRINTED WIRING BOARD, AND METHOD FOR PRODUCING PRINTED WIRING BOARD

(71) Applicant: Showa Denko Materials Co., Ltd., Tokyo (JP)

(72) Inventors: Naomitsu Komori, Tokyo (JP); Shuji Nomoto, Tokyo (JP); Akihiro Nakamura, Tokyo (JP); Hayato Sawamoto, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 692 days.

(21) Appl. No.: 18/010,144

(22) PCT Filed: Jun. 18, 2020

(86) PCT No.: PCT/JP2020/024011

§ 371 (c)(1), (2) Date: Dec. 13, 2022

(87) PCT Pub. No.: WO2021/255907

PCT Pub. Date: Dec. 23, 2021

(65) Prior Publication Data

US 2023/0221638 A1 Jul. 13, 2023

(51) Int. Cl.

*G03F 7/027* (2006.01)
*C08F 290/06* (2006.01)
(Continued)

(52) U.S. Cl.

CPC .......... *G03F 7/027* (2013.01); *C08F 290/064* (2013.01); *G03F 7/028* (2013.01);
(Continued)

(58) Field of Classification Search

None
See application file for complete search history.

(56) References Cited

U.S. PATENT DOCUMENTS

2017/0045817 A1* 2/2017 Nagoshi ............ H01L 23/49894
2022/0155681 A1* 5/2022 Sawamoto ........... H05K 1/0326

FOREIGN PATENT DOCUMENTS

CN 103926791 A 7/2014
JP 2000321765 A * 11/2000
(Continued)

OTHER PUBLICATIONS

Machine translation of JP 2001-254002 (no date) (Year: 0000).*

*Primary Examiner* — Amanda C. Walke
(74) *Attorney, Agent, or Firm* — FITCH, EVEN, TABIN & FLANNERY, LLP

(57) ABSTRACT

There is provided a photosensitive resin composition comprising (A) a photopolymerizable compound having an ethylenically unsaturated group and an acid substituent, (B) a curing agent, (C) a photopolymerization initiator, and (D) a photopolymerizable compound, wherein the photopolymerizable compound (D) is a polyfunctional monomer which has a skeleton (X) derived from a polyhydric alcohol and having three or more bonding groups (a), each bonded to another structure and corresponding to a hydroxy group from which the hydrogen atom has been removed, and which has three or more (meth)acryloyl groups bonded directly or indirectly to the bonding groups (a), and wherein at least one (meth)acryloyl group of the three or more (meth)acryloyl groups is bonded to the bonding group(s) (a) via a linking group. There are also provided a dry film using the photosensitive resin composition, a printed wiring board, and a method for producing the printed wiring board.

16 Claims, 1 Drawing Sheet

Resist cross-sectional shape: rectangular

Resist cross-sectional shape: trapezoidal

(51) Int. Cl.

| | |
|---|---|
| ***G03F 7/028*** | (2006.01) |
| ***G03F 7/029*** | (2006.01) |
| ***H05K 3/28*** | (2006.01) |
| *B32B 27/32* | (2006.01) |
| *B32B 27/36* | (2006.01) |
| *H05K 3/46* | (2006.01) |

(52) U.S. Cl.

CPC ............. *G03F 7/029* (2013.01); *H05K 3/287* (2013.01); *B32B 27/32* (2013.01); *B32B 27/36* (2013.01); *B32B 2250/24* (2013.01); *B32B 2255/10* (2013.01); *B32B 2255/26* (2013.01); *B32B 2307/304* (2013.01); *B32B 2307/306* (2013.01); *B32B 2307/54* (2013.01); *B32B 2457/08* (2013.01); *H05K 3/28* (2013.01); *H05K 3/4673* (2013.01)

(56) References Cited

FOREIGN PATENT DOCUMENTS

| | | | | | |
|---|---|---|---|---|---|
| JP | 2001-254002 | A | | 9/2001 | |
| JP | 2003131379 | A | * | 5/2003 | ........... G03F 7/0007 |
| JP | 2003-198105 | A | | 7/2003 | |
| JP | 2008-102170 | A | | 5/2008 | |
| JP | 2009-204805 | A | | 9/2009 | |
| JP | 2011-133851 | A | | 7/2011 | |
| JP | 2012-004487 | A | | 1/2012 | |
| JP | 2012-215718 | A | | 11/2012 | |
| JP | 2012-156583 | A | | 8/2014 | |
| JP | 2014-156583 | A | | 8/2014 | |
| JP | 2015052094 | A | * | 3/2015 | |
| JP | 2015-71743 | A | | 4/2015 | |
| JP | 2016-66003 | A | | 4/2016 | |
| JP | 2016-69626 | A | | 5/2016 | |
| JP | 2018-169464 | A | | 11/2018 | |
| WO | 2014/136897 | A1 | | 9/2014 | |
| WO | 2015/16360 | A1 | | 2/2015 | |
| WO | WO2017002858 | A1 | * | 1/2017 | |
| WO | 2017/122717 | A1 | | 7/2017 | |

* cited by examiner

[Fig. 1]
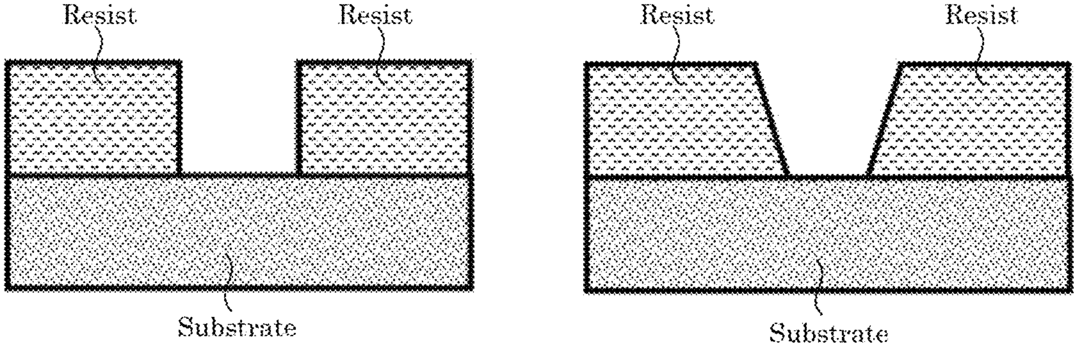
Resist cross-sectional shape: rectangular
Resist cross-sectional shape: trapezoidal
[Fig. 2]
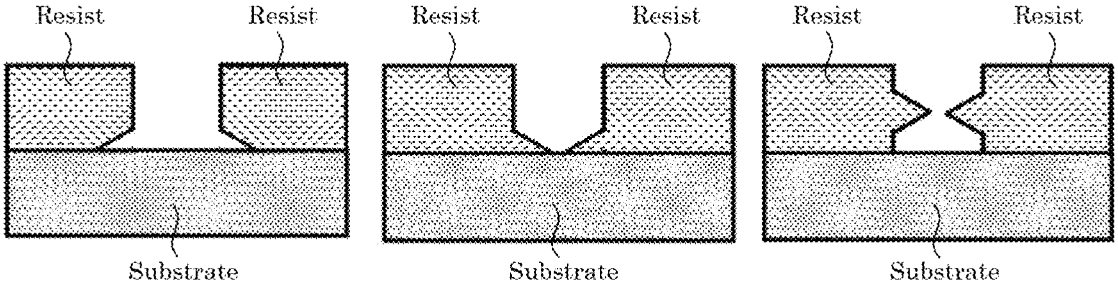
Resist cross-sectional shape: Undercut
Resist cross-sectional shape: Skirt shape (halation)
Resist cross-sectional shape: Thickening (diffraction)

PHOTOSENSITIVE RESIN COMPOSITION, DRY FILM, PRINTED WIRING BOARD, AND METHOD FOR PRODUCING PRINTED WIRING BOARD

CROSS-REFERENCE TO RELATED APPLICATIONS

This application is a U.S. national phase application filed under 35 U.S.C. § 371 of International Application No. PCT/JP2020/024011, filed Jul. 5, 2021, which is incorporated herein by reference in its entirety.

TECHNICAL FIELD

The present disclosure relates to a photosensitive resin composition, a dry film, a printed wiring board, and a method for producing the printed wiring board.

BACKGROUND ART

In the field of producing printed wiring boards, it is common practice to form a permanent mask resist on a printed wiring board. The permanent mask resist functions to prevent corrosion of a conductor layer and to ensure electrical insulation between conductor layers during use of the printed wiring board. In recent years, a permanent mask resist also functions as a solder resist film which prevents solder from attaching to an unnecessary portion of a conductor layer of a printed wiring board in the process of flip-chip mounting or wire-bonding semiconductor devices to the printed wiring board via solder.

Such a permanent mask resist is formed, for example, by screen printing using a thermosetting resin composition or by photolithography using a photosensitive resin composition. For example, in a flexible wiring board which uses a mounting method such as FC (Flip Chip), TAB (Tape Automated Bonding), or COF (Chip On Film), a thermosetting resin paste is screen-printed on an area other than IC chips, electronic parts or an LCD (Liquid Crystal Display) panel, and connecting wiring portions, followed by thermal curing of the printed paste to form a permanent mask resist (see, for example, patent document 1).

Further, in a semiconductor package substrate such as a BGA (Ball Grid Array) or a CSP (Chip Size Package), mounted on an electronic part, (1) to flip-chip mount semiconductor devices to the semiconductor package substrate via solder, (2) to wire-bond semiconductor devices to the semiconductor package substrate, or (3) to bond the semiconductor package substrate to a mother board substrate by soldering, it is necessary to remove a permanent mask resist from a portion to be bonded. Therefore, the formation of the permanent mask resist is performed using a photolithographic imaging method which involves applying and drying a photosensitive resin composition, selectively irradiating the dried composition with actinic rays, such as ultraviolet rays, to cure the composition, and then removing only non-irradiated portions of the composition by development. Such a photolithography method, because of its good workability, is suited for mass production and is widely used for imaging of a photosensitive resin composition in the electronic material industry (see, for example, patent document 2).

In the production of a printed wiring board, a permanent mask resist is generally required to have insulating properties, resistance to copper plating and to gold plating, resistance to moist heat, resistance to thermal shock (TCT resistance), HAST resistance to a highly accelerated stress test (HAST) between fine wirings and, in the case of a permanent mask resist of a photosensitive resin composition, it is also required to have good resolution in photolithography. As the density of printed wiring boards increases these days, permanent mask resists are required to have enhanced performance. In particular, there is an increasing demand for the formation of fine patterns, heat resistance, thermal shock resistance, and insulating properties; it is important to achieve a good balance between them.

A conceivable method for enhancing reliability is to add an elastomer to a photosensitive resin composition to impart flexibility to the composition (see, for example, patent document 3).

CITATION LIST

Patent Literature

Patent document 1: Japanese Patent Laid-Open Publication No. 2003-198105

Patent document 2: Japanese Patent Laid-Open Publication No. 2011-133851

Patent document 3: Japanese Patent Laid-Open Publication No. 2009-204805

SUMMARY OF INVENTION

Technical Problem

However, in order to impart flexibility, it is generally necessary to use a resin having a low glass transition temperature and a high weight-average molecular weight, which may result in a considerable reduction in the heat resistance and in the HAST resistance. On the other hand, the use of a resin having a high glass transition temperature can ensure excellent heat resistance and HAST resistance. However, the use of such a resin may reduce the thermal shock resistance due to a reduction in the flexibility, and may also considerably reduce the alkali solubility, thereby deteriorating the developability. Because of such a trade-off, a satisfactory achievement of a good balance between resolution, heat resistance, thermal shock resistance and insulating properties has not been made yet.

It is therefore an object of the present invention to provide a photosensitive resin composition capable of forming a cured product which is excellent in the resolution, has flexibility with a high degree of elongation and has a high tensile strength against an external stress, and is excellent in the heat resistance, the thermal shock resistance and the insulating properties, and to provide a dry film using the photosensitive resin composition, a printed wiring board, and a method for producing the printed wiring board.

Solution to Problem

The present inventors, through their intensive studies, have found that the above object can be attained by the present invention described below. The present invention has been accomplished based on this finding.

Thus, the present invention relates to the following [1] to [15].

[1] A photosensitive resin composition comprising (A) a photopolymerizable compound having an ethylenically unsaturated group and an acid substituent, (B) a curing agent, (C) a photopolymerization initiator, and (D) a photopolymerizable compound, wherein the photopolymerizable compound (D) is a polyfunctional monomer which has a skeleton (X) derived from a polyhydric alcohol and having three or more bonding groups (a), each bonded to another structure and corresponding to a hydroxy group from which the hydrogen atom has been removed, and which has three or more (meth) acryloyl groups bonded directly or indirectly to the bonding groups (a), and wherein at least one (meth) acryloyl group of the three or more (meth)acryloyl groups is bonded to the bonding group(s) (a) via a linking group.

[2] The photosensitive resin composition as described in [1] above, wherein the skeleton (X) is a skeleton derived from a polyhydric alcohol selected from the group consisting of glycerin, diglycerin, trimethylolpropane, ditrimethylolpropane, pentaerythritol and dipentaerythritol.

[3] The photosensitive resin composition as described in [1] or [2] above, wherein in the photopolymerizable compound (D), the number of the (meth)acryloyl groups, bonded to the bonding groups (a) via the linking group, is 3 to 10. [4] The photosensitive resin composition as described in any one of [1] to [3] above, wherein the linking group is a divalent group comprising an alkylene oxide structural unit, or a divalent group derived from a hydroxy acid.

[5] The photosensitive resin composition as described in [4] above, wherein the alkylene oxide structural unit is an alkylene oxide structural unit having 2 to 4 carbon atoms, and the hydroxy acid is an aliphatic hydroxy acid having 2 to 10 carbon atoms.

[6] The photosensitive resin composition as described in any one of [1] to [5] above, wherein the photopolymerizable compound (A) having an ethylenically unsaturated group and an acid substituent is an acid-modified ethylenically unsaturated group-containing epoxy derivative obtained by reacting a resin (A'), which has been obtained by reacting an epoxy resin (a) and an ethylenically unsaturated group-containing organic acid (b), with a saturated or unsaturated group-containing polybasic acid anhydride (c).

[7] The photosensitive resin composition as described in [6] above, wherein the photopolymerizable compound (A) having an ethylenically unsaturated group and an acid substituent comprises a photopolymerizable compound (A1) having an ethylenically unsaturated group and an acid substituent, obtained by using a bisphenol novolac epoxy resin (a1) as the epoxy resin (a), and a photopolymerizable compound (A2) having an ethylenically unsaturated group and an acid substituent, obtained by using an epoxy resin (a2), which differs from the bisphenol novolac epoxy resin (a1), as the component (a).

[8] The photosensitive resin composition as described in [7] above, wherein the epoxy resin (a2) is at least one selected from the group consisting of a novolac epoxy resin different from the bisphenol novolac epoxy resin (a1), a bisphenol A epoxy resin, a bisphenol F epoxy resin, a triphenol methane epoxy resin, and a biphenyl epoxy resin.

[9] The photosensitive resin composition as described in any one of [1] to [8] above, wherein the photopolymerization initiator (C) is at least one selected from the group consisting of an alkylphenone photopolymerization initiator, a thioxanthone photopolymerization initiator having a thioxanthone skeleton, a benzophenone photopolymerization initiator, an oxime ester photopolymerization initiator, and an acylphosphine oxide photopolymerization initiator.

[10] The photosensitive resin composition as described in any one of [1] to [9] above, further comprising (E) an inorganic filler.

[11] The photosensitive resin composition as described in any one of [1] to [10] above, wherein the content of the photopolymerizable compound (A) having an ethylenically unsaturated group and an acid substituent, the content of the curing agent (B), the content of the photopolymerization initiator (C), and the content of the photopolymerizable compound (D) are 20 to 80% by mass, 2 to 40% by mass, 0.2 to 15% by mass, and 1 to 15% by mass, respectively, based on the total solid content of the photosensitive resin composition.

[12] A dry film comprising a carrier film and a photosensitive layer using the photosensitive resin composition as described in any one of [1] to [11] above.

[13] A printed wiring board having a surface protective film or an interlayer insulating layer formed from the photosensitive resin composition as described in any one of [1] to [11] above.

[14] The printed wiring board as described in [13] above, wherein the surface protective film or the interlayer insulating layer has a thickness of 5 μm or more.

[15] A method for producing a printed wiring board, comprising the sequential steps of providing a photosensitive layer on a substrate by using the photosensitive resin composition as described in any one of [1] to [11] above or the dry film as described in [12] above; forming a resist pattern by using the photosensitive layer; and curing the resist pattern to form a surface protective film or an interlayer insulating layer.

Advantageous Effects of Invention

The present invention makes it possible to provide a photosensitive resin composition capable of forming a cured product which is excellent in the resolution, has flexibility with a high degree of elongation and has a high tensile strength against an external stress, and is excellent in the heat resistance, the thermal shock resistance and the insulating properties, and to provide a dry film using the photosensitive resin composition, a printed wiring board, and a method for producing the printed wiring board.

BRIEF DESCRIPTION OF DRAWINGS

FIG. 1 is a schematic diagram illustrating a cross-sectional shape of a resist which is excellent in the linearity of the contour of a resist pattern.

FIG. 2 is a schematic diagram illustrating a cross-sectional shape of a resist which is poor in the linearity of the contour of a resist pattern.

DESCRIPTION OF EMBODIMENTS

The upper limit or the lower limit of a numerical range described herein may be replaced with a value shown in the working examples. When a plurality of materials are present as a component in a photosensitive resin composition, the content of the component herein refers to the total content of the plurality of materials present in the composition unless otherwise indicated.

Any arbitrary combination of features or embodiments as described herein may be included in the scope of the present invention.

As used herein, the term "solid content" refers to the content of non-volatile matter free of volatile matter, such as water or a solvent, contained in a photosensitive resin composition, i.e. the content of a component which remains unevaporated when the resin composition is dried. The component includes one which is in a liquid form, a starch syrup-like form or a waxy form at room temperature around 25° C.

As used herein, the term "(meth)acrylate" refers to acrylate or methacrylate. The same holds true for other similar terms.

[Photosensitive Resin Composition]

The photosensitive resin composition of this embodiment comprises (A) a photopolymerizable compound having an ethylenically unsaturated group and an acid substituent, (B) a curing agent, (C) a photopolymerization initiator, and (D) a photopolymerizable compound, wherein the photopolymerizable compound (D) is a polyfunctional monomer which has a skeleton (X) derived from a polyhydric alcohol and having three or more bonding groups (a), each bonded to another structure and corresponding to a hydroxy group from which the hydrogen atom has been removed, and which has three or more (meth)acryloyl groups bonded directly or indirectly to the bonding groups (a), and wherein at least one (meth)acryloyl group of the three or more (meth)acryloyl groups is bonded to the bonding group(s) (a) via a linking group.

The above components may be hereinafter referred to simply as the component (A), the component (B), the component (C), and the component (D). The same holds true for other components.

<(A) Photopolymerizable Compound Having an Ethylenically Unsaturated Group and an Acid Substituent>

The photosensitive resin composition of this embodiment contains, as the component (A), a photopolymerizable compound having an ethylenically unsaturated group and an acid substituent.

Either a single compound or a combination of two or more compounds may be used as the component (A).

The component (A) is a compound which has photopolymerizability owing to its inclusion of an ethylenically unsaturated group. As used herein, the term "ethylenically unsaturated group" refers to a substituent having an ethylenically unsaturated bond. The "ethylenically unsaturated bond" refers to a carbon-carbon double bond capable of an addition reaction and excludes a double bond in an aromatic ring.

Examples of the ethylenically unsaturated group contained in the component (A) include a vinyl group, an allyl group, a propargyl group, a butenyl group, an ethynyl group, a phenylethynyl group, a maleimide group, a nadimide group, and a (meth)acryloyl group. Among them, a (meth) acryloyl group is preferred from the viewpoint of reactivity and resolution.

Examples of the acid substituent contained in the component (A) include a carboxy group, a sulfonic acid group, and a phenolic hydroxy group. Among them, a carboxy group is preferable from the viewpoint of resolution.

The component (A) is preferably an acid-modified ethylenically unsaturated group-containing epoxy derivative obtained by reacting a resin (A'), which has been obtained by reacting an epoxy resin (a) and an ethylenically unsaturated group-containing organic acid (b), with a saturated or unsaturated group-containing polybasic acid anhydride (c).

The component (A) preferably comprises a photopolymerizable compound (A1) having an ethylenically unsaturated group and an acid substituent, obtained by using a bisphenol novolac epoxy resin (a1) as the component (a), from the viewpoint of preventing the formation of an undercut and from the viewpoint of adhesion to a copper substrate, a reduction in the warpage of a film substrate (hereinafter also referred to as "warpage reduction"), thermal shock resistance, and resolution. The component (A) more preferably comprises the component (A1) and a photopolymerizable compound (A2) having an ethylenically unsaturated group and an acid substituent, obtained by using an epoxy resin (a2), which differs from the bisphenol novolac epoxy resin (a1), as the component (a) especially from the viewpoint of enhancing the adhesion strength.

Preferred embodiments of the component (A), obtained from the epoxy resin (a), the ethylenically unsaturated group-containing organic acid (b) and the saturated or unsaturated group-containing polybasic acid anhydride (c), will now be described.

(Bisphenol Novolac Epoxy Resin (a1))

From the same viewpoints as described above, the component (a1) is preferably a bisphenol novolac epoxy resin having a structural unit represented by the following formula (I) or (II), more preferably a bisphenol novolac epoxy resin having a structural unit represented by the following formula (II).

[Epoxy Resin Having a Structural Unit Represented by General Formula (I)]

One preferred embodiment of the component (a1) is an epoxy resin having a structural unit represented by the following general formula (I):

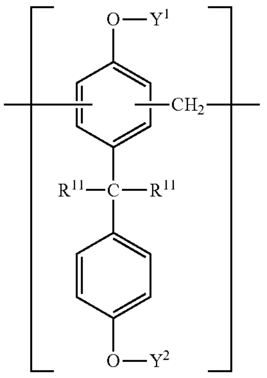

(I)

where $R^{11}$'s are each independently a hydrogen atom or a methyl group, $Y^1$ and $Y^2$ are each independently a hydrogen atom or a glycidyl group, and at least one of $Y^1$ and $Y^2$ is a glycidyl group.

Each $R^{11}$ in the general formula (I) is preferably a hydrogen atom from the viewpoint of preventing the formation of an undercut and from the viewpoint of the linearity of the contour of a resist pattern and resolution.

From the same viewpoints and from the viewpoint of thermal shock resistance and warpage reduction, $Y^1$ and $Y^2$ are each preferably a glycidyl group.

The number of structural units, each represented by the general formula (I), in the component (a1) comprising the structural units is a number equal to or greater than 1, preferably a number of 10 to 100, more preferably a number of 12 to 80, and even more preferably a number of 15 to 70.

When the number of the structural units is within the above range, the photosensitive resin composition tends to be excellent in the linearity of the contour of a resist pattern, the adhesion to a copper substrate, the heat resistance and the electrical insulating properties.

The number of structural units takes an integer value for a single molecule, while it takes a rational number, which is an average value, for an aggregate of different types of molecules. The same holds true for the number of structural units described below.

[Epoxy Resin Having a Structural Unit Represented by General Formula (II)]

One preferred embodiment of the component (a1) is an epoxy resin having a structural unit represented by the following general formula (II):

(II)

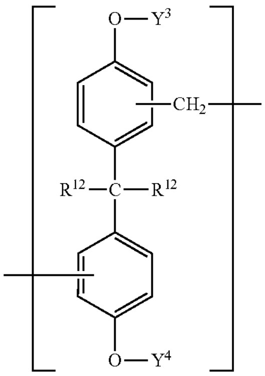

where $R^{12}$'s are each independently a hydrogen atom or a methyl group, $Y^3$ and $Y^4$ are each independently a hydrogen atom or a glycidyl group, and at least one of $Y^3$ and $Y^4$ is a glycidyl group.

Each $R^{12}$ in the general formula (II) is preferably a hydrogen atom from the viewpoint of preventing the formation of an undercut and from the viewpoint of the linearity of the contour of a resist pattern and resolution.

From the same viewpoints and from the viewpoint of thermal shock resistance and warpage reduction, $Y^3$ and $Y^4$ are each preferably a glycidyl group.

The number of structural units, each represented by the general formula (II), in the component (a1) comprising the structural units is a number equal to or greater than 1, preferably a number of 10 to 100, more preferably a number of 12 to 80, and even more preferably a number of 15 to 70. When the number of the structural units is within the above range, the photosensitive resin composition tends to be excellent in the linearity of the contour of a resist pattern, the adhesion to a copper substrate, and the heat resistance.

An epoxy resin having a structural unit represented by the general formula (II), in which each $R^{12}$ is a hydrogen atom, and $Y^3$ and $Y^4$ are each a glycidyl group, is commercially available with the trade name EXA-7376 Series (manufactured by DIC Corporation). An epoxy resin having a structural unit represented by the general formula (II), in which each $R^{12}$ is a methyl group, and $Y^3$ and $Y^4$ are each a glycidyl group, is commercially available with the trade name EPON SU8 Series (manufactured by Mitsubishi Chemical Corporation).

(Epoxy Resin (a2))

There is no particular limitation on the component (a2) as long as it is an epoxy resin different from the bisphenol novolac epoxy resin (a1); however, from the viewpoint of preventing the formation of an undercut and from the viewpoint of the linearity of the contour of a resist pattern, adhesion to a copper substrate, and resolution, the component (a2) is preferably at least one selected from the group consisting of a novolac epoxy resin, a bisphenol A epoxy resin, a bisphenol F epoxy resin, a triphenol methane epoxy resin, and a biphenyl epoxy resin.

The novolac epoxy resin is preferably one having a structural unit represented by the following general formula (III). The bisphenol A epoxy resin or the bisphenol F epoxy resin is preferably one having a structural unit represented by the following general formula (IV). The triphenol methane epoxy resin is preferably one having a structural unit represented by the following general formula (V). The biphenyl epoxy resin is preferably one having a structural unit represented by the following general formula (VI).

[Epoxy Resin Having a Structural Unit Represented by General Formula (III)]

A novolac epoxy resin having a structural unit represented by the following general formula (III) is preferably used as the component (a2). The novolac epoxy resin having such a structural unit can be exemplified by a novolac epoxy resin represented by the following general formula (III').

(III)

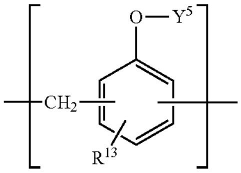

(III')

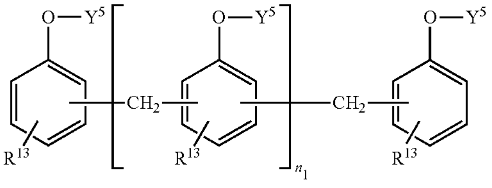

where $R^{13}$'s are each independently a hydrogen atom or a methyl group, $Y^5$'s are each independently a hydrogen atom or a glycidyl group, $n_1$ is a number equal to or greater than 1, and at least one of $Y^5$'s is a glycidyl group.

In the general formulae (III) and (III'), each $R^{13}$ is preferably a hydrogen atom from the viewpoint of preventing the formation of an undercut and from the viewpoint of the linearity of the contour of a resist pattern and resolution.

In the general formula (III'), the molar ratio of $Y^5$ which is a hydrogen atom to $Y^5$ which is a glycidyl group [hydrogen atom/glycidyl group] is preferably 0/100 to 30/70, more preferably 0/100 to 10/90 from the viewpoint of preventing the formation of an undercut and from the viewpoint of the linearity of the contour of a resist pattern and resolution.

In the general formula (III'), $n_1$ is a number equal to or greater than 1, preferably a number of 10 to 200, more preferably a number of 20 to 150, and even more preferably a number of 30 to 100. When $n_1$ is within the above range, the photosensitive resin composition tends to be excellent in the linearity of the contour of a resist pattern, the adhesion to a copper substrate, and the heat resistance.

The novolac epoxy resin represented by the general formula (III') is, for example, a phenol novolac epoxy resin or a cresol novolac epoxy resin. Such a novolac epoxy resin can be obtained, for example, by reacting a phenol novolac resin or a cresol novolac resin with epichlorohydrin by a known method.

Examples of commercially available phenol novolac epoxy resins or cresol novolac epoxy resins, represented by the general formula (III'), include YDCN-701, YDCN-702, YDCN-703, YDCN-704, YDCN-704L, YDPN-638 and YDPN-602 (trade names, manufactured by NIPPON STEEL Chemical & Material Co., Ltd.), DEN-431 and DEN-439 (trade names, manufactured by The Dow Chemical Company), EOCN-120, EOCN-102S, EOCN-103S, EOCN-104S, EOCN-1012, EOCN-1025, EOCN-1027 and BREN (trade names, manufactured by Nippon Kayaku Co., Ltd.), EPN-1138, EPN-1235 and EPN-1299 (trade names, manufactured by BASF Inc.), and N-730, N-770, N-865, N-665, N-673, VH-4150 and VH-4240 (trade names, manufactured by DIC Corporation).

[Epoxy Resin Having a Structural Unit Represented by General Formula (IV)]

A bisphenol A epoxy resin or a bisphenol F epoxy resin, having a structural unit represented by the following general formula (IV), is preferably used as the component (a2). The epoxy resin having such a structural unit can be exemplified by a bisphenol A epoxy resin or a bisphenol F epoxy resin, represented by the following general formula (IV').

the formation of an undercut and from the viewpoint of the linearity of the contour of a resist pattern and resolution.

From the same viewpoints and from the viewpoint of thermal shock resistance and warpage reduction, $Y^6$ is preferably a glycidyl group.

In the general formula (IV'), $n_2$ is a number equal to or greater than 1, preferably a number of 10 to 100, more preferably a number of 12 to 80, and even more preferably a number of 15 to 60. When $n_2$ is within the above range, the photosensitive resin composition tends to be excellent in the linearity of the contour of a resist pattern, the adhesion to a copper substrate, and the heat resistance.

A bisphenol A epoxy resin or a bisphenol F epoxy resin, represented by the general formula (IV') wherein $Y^6$ is a glycidyl group, can be obtained, for example, by reacting the hydroxy group (—$OY^6$) of a bisphenol A epoxy resin or a bisphenol F epoxy resin, represented by the general formula (IV') wherein $Y^6$ is a hydrogen atom, with epichlorohydrin.

In order to promote the reaction between the hydroxy group and epichlorohydrin, it is preferred to carry out the reaction in a polar organic solvent such as dimethylformamide, dimethylacetamide, or dimethylsulfoxide in the presence of an alkali metal hydroxide at a reaction temperature of 50 to 120° C. When the reaction temperature is within the above range, the reaction will not be too slow, and a side reaction can be inhibited.

(IV)

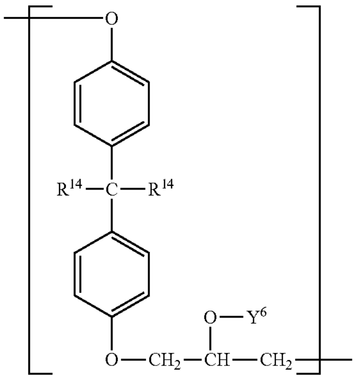

(IV')

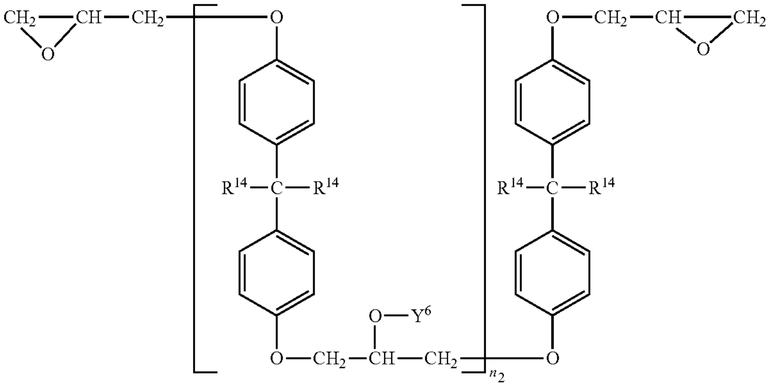

where $R^{14}$'s are each independently a hydrogen atom or a methyl group, $Y^6$ is a hydrogen atom or a glycidyl group, $n_2$ is a number equal to or greater than 1 and, when $n_2$ is 2 or more, the $Y^6$'s may be the same or different, and at least one of the $Y^6$'s is a glycidyl group.

Each $R^{14}$ in the general formulae (IV) and (IV') is preferably a hydrogen atom from the viewpoint of preventing Examples of commercially available bisphenol A epoxy resins or bisphenol F epoxy resins, represented by the general formula (IV'), include jER807, jER815, jER825, jER827, jER828, jER834, jER1001, jER1004, jER1007 and jER1009 (trade names, manufactured by Mitsubishi Chemical Corporation), DER-330, DER-301 and DER-361 (trade names, manufactured by The Dow Chemical Company), and YD-8125, YDF-170, YDF-175S, YDF-2001, YDF-2004 and YDF-8170 (trade names, manufactured by NIPPON STEEL Chemical & Material Co., Ltd.).

[Epoxy Resin Having a Structural Unit Represented by General Formula (V)]

A triphenol methane epoxy resin having a structural unit represented by the following general formula (V) is preferably used as the component (a2). The triphenol methane epoxy resin having such a structural unit can be exemplified by a triphenol methane epoxy resin represented by the following general formula (V').

(V)

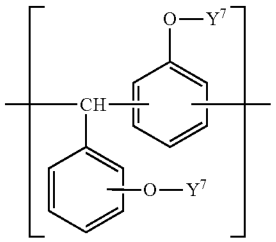

(V')

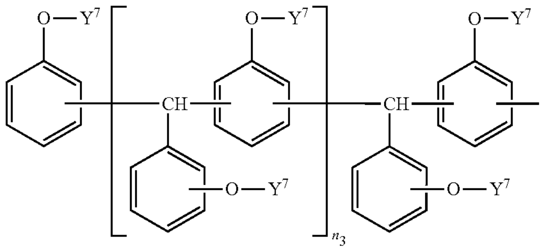

where $Y^7$'s are each independently a hydrogen atom or a glycidyl group, at least one of $Y^7$'s is a glycidyl group, and $n_3$ is a number equal to or greater than 1.

In the triphenol methane epoxy resin represented by the general formula (V'), the molar ratio of $Y^7$ which is a hydrogen atom to $Y^7$ which is a glycidyl group [hydrogen atom/glycidyl group] is preferably 0/100 to 30/70 from the viewpoint of preventing the formation of an undercut and the formation of a defect in an upper portion of a resist pattern and from the viewpoint of the linearity of the contour of a resist pattern and resolution.

In the general formula (V'), $n_3$ is a number equal to or greater than 1, preferably a number of 10 to 100, more preferably a number of 12 to 80, and even more preferably a number of 15 to 70. When $n_3$ is within the above range, the photosensitive resin composition tends to be excellent in the linearity of the contour of a resist pattern, the adhesion to a copper substrate, and the heat resistance.

Examples of commercially available triphenol methane epoxy resins, represented by the general formula (V'), include FAE-2500, EPPN-501H and EPPN-502H (trade names, manufactured by Nippon Kayaku Co., Ltd.).

[Epoxy Resin Having a Structural Unit Represented by General Formula (VI)]

A biphenyl epoxy resin having a structural unit represented by the following general formula (VI) is preferably used as the component (a2). The biphenyl epoxy resin having such a structural unit can be exemplified by a biphenyl epoxy resin represented by the following general formula (VI').

(VI)

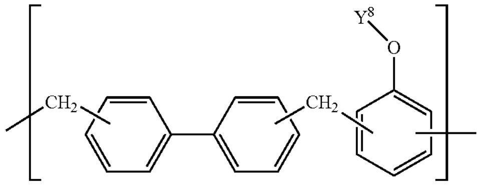

(VI')

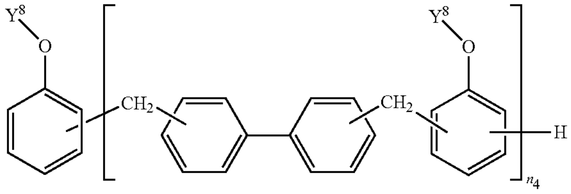

where $Y^8$'s are each independently a hydrogen atom or a glycidyl group, and $n_4$ is a number equal to or greater than 1.

Examples of commercially available biphenyl epoxy resins, represented by the general formula (VI'), include NC-3000, NC-3000-L, NC-3000-H, NC-3000-FH-75M, NC-3100 and CER-3000-L (trade names, manufactured by Nippon Kayaku Co., Ltd.).

The component (a2) is preferably at least one selected from the group consisting of a novolac epoxy resin having a structural unit represented by the general formula (III), a bisphenol A epoxy resin having a structural unit represented by the general formula (IV), and a bisphenol F epoxy resin having a structural unit represented by the general formula (IV), more preferably a bisphenol F epoxy resin having a structural unit represented by the general formula (IV).

From the viewpoint of thermal shock resistance, warpage reduction, and resolution, it is preferred to use a combination of the component (A1) obtained by using, as the component (a1), a bisphenol novolac epoxy resin having a structural unit represented by the general formula (II), and the component (A2) obtained by using, as the component (a2), a bisphenol A epoxy resin or a bisphenol F epoxy resin having a structural unit represented by the general formula (IV).

(Ethylenically Unsaturated Group-Containing Organic Acid (b))

Examples of the component (b) include acrylic acid derivatives such as acrylic acid, a dimer of acrylic acid, methacrylic acid, β-furfuryl acrylic acid, β-styryl acrylic acid, cinnamic acid, crotonic acid, and α-cyano cinnamic acid; a half ester compound which is a reaction product of a hydroxy group-containing acrylate and a dibasic acid anhydride; and a half ester compound which is a reaction product of a vinyl group-containing monoglycidyl ether or a vinyl group-containing monoglycidyl ester and a dibasic acid anhydride. Either a single compound or a combination of two or more compounds may be used as the component (b).

Such a half ester compound is obtained, for example, by reacting a dibasic acid anhydride with a hydroxy group-containing acrylate, a vinyl group-containing monoglycidyl ether or a vinyl group-containing monoglycidyl ester.

Examples of the hydroxy group-containing acrylate, the vinyl group-containing monoglycidyl ether and the vinyl group-containing monoglycidyl ester, which are for use in the synthesis of a half ester compound, include hydroxyethyl (meth)acrylate, hydroxypropyl (meth)acrylate, hydroxy-butyl (meth)acrylate, polyethylene glycol mono(meth)acrylate, trimethylolpropane di(meth)acrylate, pentaerythritol tri (meth)acrylate, dipentaerythritol penta(meth)acrylate, and glycidyl (meth)acrylate.

The dibasic acid anhydride for use in the synthesis of a half ester compound includes a dibasic acid anhydride containing a saturated group, and a dibasic acid anhydride containing an unsaturated group.

Specific examples of the dibasic acid anhydride include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, and itaconic anhydride.

The reaction between the components (a) and (b) is preferably carried out such that 0.6 to 1.05 equivalents, more preferably 0.8 to 1.0 equivalents of the component (b) is reacted with 1 equivalent of the epoxy group in the component (a). When the components are reacted at such a ratio, the photosensitive resin composition tends to have an increased photosensitivity, leading to excellent linearity of the contour of a resist pattern.

The components (a) and (b) may be reacted when they are dissolved in an organic solvent.

Examples of the organic solvent include ketones such as methyl ethyl ketone and cyclohexanone; aromatic hydrocarbons such as toluene, xylene, and tetramethylbenzene; glycol ethers such as methyl cellosolve, butyl cellosolve, methyl carbitol, butyl carbitol, propylene glycol monomethyl ether, dipropylene glycol monoethyl ether, dipropylene glycol diethyl ether, and triethylene glycol monoethyl ether; esters such as ethyl acetate, butyl acetate, butyl cellosolve acetate, and carbitol acetate; aliphatic hydrocarbons such as octane and decane; and petroleum solvents such as petroleum ether, petroleum naphtha, hydrogenated petroleum naphtha, and solvent naphtha. These solvents may be used singly or in a combination of two or more.

A catalyst may be used to promote the reaction between the components (a) and (b).

Examples of the catalyst include triethylamine, benzylmethylamine, methyltriethylammonium chloride, benzyltrimethylammonium chloride, benzyltrimethylammonium bromide, benzyltrimethylammonium iodide, and triphenylphosphine. These catalysts may be used singly or in a combination of two or more.

From the viewpoint of promoting the reaction, the amount of the catalyst is preferably 0.01 to 10 parts by mass, more preferably 0.05 to 2 parts by mass, and even more preferably 0.1 to 1 part by mass per 100 parts by mass of the total amount of the components (a) and (b).

A polymerization inhibitor may be used in the reaction between the components (a) and (b) in order to inhibit polymerization during the reaction.

Examples of the polymerization inhibitor include hydroquinone, methylhydroquinone, hydroquinone monomethyl ether, catechol, and pyrogallol. These compounds may be used singly or in a combination of two or more.

From the viewpoint of enhancing the stability, the amount of the polymerization inhibitor is preferably 0.01 to 1 part by mass, more preferably 0.02 to 0.8 parts by mass, and even more preferably 0.04 to 0.5 parts by mass per 100 parts by mass of the total amount of the components (a) and (b).

From the viewpoint of productivity, the reaction between the components (a) and (b) is preferably carried out at a temperature of 60 to 150° C., more preferably 80 to 120° C., and even more preferably 90 to 110° C.

The component (A') obtained by reacting the components (a) and (b) has a hydroxy group formed by a ring-opening addition reaction between an epoxy group in the component (a) and a carboxy group in the component (b). By reacting the component (A') with the saturated or unsaturated group-containing polybasic acid anhydride (c), a hydroxy group in the component (A') (including a hydroxy group originally present in the component (a)) is half-esterified with an acid anhydride group in the component (c) to obtain an acid-modified ethylenically unsaturated group-containing epoxy derivative.

(Saturated or Unsaturated Group-Containing Polybasic Acid Anhydride (c))

A polybasic acid anhydride containing a saturated group or a polybasic acid anhydride containing an unsaturated group can be used as the component (c).

Specific examples of the component (c) include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, and itaconic anhydride. Among them, tetrahydrophthalic anhydride is preferred from the viewpoint of resolution.

Either a single compound or a combination of two or more compounds may be used as the component (c).

In the reaction between the components (A') and (c), the component (c), e.g. in an amount of 0.1 to 1.0 equivalent, is reacted with 1 equivalent of the hydroxy group in the component (A'), so that the acid value of the acid-modified ethylenically unsaturated group-containing epoxy derivative can be adjusted.

From the viewpoint of productivity, the reaction between the components (A') and (c) is preferably carried out at a temperature of 50 to 150° C., more preferably 60 to 120° C., and even more preferably 70 to 100° C.

A hydrogenated bisphenol A epoxy resin, for example, can be used as part of the component (a) as necessary. Further, a styrene-maleic acid resin, such as a styrene-maleic anhydride copolymer modified with hydroxyethyl (meth) acrylate, can be used as part of the component (A).

(Acid Value of Component (A))

While there is no particular limitation on the acid value of the component (A), it is preferably 30 to 150 mgKOH/g, more preferably 40 to 120 mgKOH/g, and even more preferably 50 to 100 mgKOH/g. When the acid value is equal to or higher than the lower limit, the photosensitive resin composition tends to be excellent in the solubility in a dilute alkaline solution. When the acid value is equal to or lower than the upper limit, the photosensitive resin composition tends to be excellent in the electrical properties of the cured film.

(Molecular Weight of Component (A))

While there is no particular limitation on the weight-average molecular weight of the component (A), it is preferably 3,000 to 30,000, more preferably 4,000 to 25,000, and even more preferably 5,000 to 18,000. When the weight-average molecular weight is within the above range, the photosensitive resin composition tends to be excellent in the linearity of the contour of a resist pattern, the adhesion to a copper substrate, the heat resistance, and the electrical insulating properties.

The weight-average molecular weight herein refers to a weight-average molecular weight in terms of polystyrene, measured by gel permeation chromatography (GPC) using tetrahydrofuran as a solvent. For example, a value obtained by performing measurement using the following GPC apparatus and conditions, followed by calculation using a calibration curve for standard polystyrene, can be taken as a weight-average molecular weight. The calibration curve can be prepared using a 5-sample set ("PStQuick MP-H" and "PStQuick B", manufactured by Tosoh Corporation) as standard polystyrene.

(GPC Measurement Apparatus)

GPC apparatus: high-speed GPC apparatus "HCL-8320 GPC" using a differential refractometer or a UV detector as a detector, manufactured by Tosoh Corporation Column: Column TSKgel SuperMultipore HZ-H (column length: 15 cm, inner diameter: 4.6 mm), manufactured by Tosoh Corporation (Measurement Conditions)

Solvent: tetrahydrofuran (THF)

Measurement temperature: 40° C.

Flow rate: 0.35 ml/min

Sample concentration: 10 mg/THF 5 ml

Injection amount: 20 μl (Content of Component (A))

While there is no particular limitation on the content of the component (A) in the photosensitive resin composition of this embodiment, it is preferably 20 to 80% by mass, more preferably 25 to 70% by mass, and even more preferably 30 to 50% by mass based on the total solid content of the photosensitive resin composition from the viewpoint of enhancing the heat resistance, the electrical properties and the chemical resistance of the coating film.

(Total Content of Component (A1) and Component (A2) in Component (A))

When a combination of the component (A1) and the component (A2) is used as the component (A), the total content of the component (A1) and the component (A2) in the component (A) is not particularly limited; however, it is preferably 80 to 100% by mass, more preferably 90 to 100% by mass, even more preferably 95 to 100% by mass, and may be 100% by mass from the viewpoint of the linearity of the contour of a resist pattern, resistance to electroless plating, and heat resistance.

Also when either one of the components (A1) and (A2) is used as an acid-modified ethylenically unsaturated group-containing epoxy derivative, the content of the component (A1) or the component (A2) in the component (A) may be appropriately selected from the above range.

(Mass Ratio of Component (A1) to Component (A2))

When a combination of the component (A1) and the component (A2) is used as the component (A), the mass ratio [(A1/A2)] is not particularly limited; however, it is preferably 20/80 to 90/10, more preferably 30/70 to 80/20, even more preferably 40/60 to 75/25, and still more preferably 50/50 to 70/30 from the viewpoint of the linearity of the contour of a resist pattern, resistance to electroless plating, and heat resistance.

<(B) Curing Agent>

The photosensitive resin composition of this embodiment contains the curing agent (B).

The component (B) may be a compound which itself is cured e.g. by heat or ultraviolet rays, or a compound which is cured, e.g. by heat or ultraviolet rays, with a carboxy group or a hydroxy group of the component (A), the component (D), etc. which are photocurable components in the photosensitive resin composition of this embodiment.

The use of the curing agent (B) can enhance the heat resistance, the adhesion, the chemical resistance, etc. of the final cured film.

Either a single compound or a combination of two or more compounds may be used as the component (B).

The component (B) may be a thermosetting compound such as an epoxy compound, a block-type isocyanate, a melamine compound, or an oxazoline compound.

Examples of the epoxy compound include the epoxy compounds described above as the component (a).

An addition reaction product of a polyisocyanate compound and an isocyanate blocking agent can be used as the block-type isocyanate.

Examples of the melamine compound include triaminotriazine, hexamethoxymelamine, and hexabutoxylated melamine.

Among them, an epoxy compound (epoxy resin) is preferred from the viewpoint of further enhancing the heat resistance of the cured film.

Among the epoxy compounds described above as the component (a), a bisphenol epoxy resin such as a bisphenol A epoxy resin or a bisphenol F epoxy resin, and a novolac epoxy resin are preferred as the epoxy compound.

The epoxy compound may be liquid or solid at room temperature (25° C.).

(Content of Component (B))

While there is no particular limitation on the content of the component (B) in the photosensitive resin composition of this embodiment, it is preferably 2 to 40% by mass, more preferably 3 to 30% by mass, and even more preferably 5 to 20% by mass based on the total solid content of the photosensitive resin composition. When the content of the component (B) is within the above range, the photosensitive resin composition tends to be excellent in the adhesion and the heat resistance of the cured film formed while maintaining good resolution.

When an epoxy compound is used as the component (B), an epoxy resin curing agent may be used concomitantly in order to further enhance various properties of the final cured film, such as the heat resistance, the adhesion, and the chemical resistance.

Examples of the epoxy resin curing agent include imidazole derivatives such as 2-methylimidazole, 2-ethyl-4-methylimidazole, 1-benzyl-2-methylimidazole, 2-phenylimidazole, and 2-phenyl-4-methyl-5-hydroxymethylimidazole; guanamines such as acetoguanamine and benzoguanamine; polyamines such as diaminodiphenylmethane, m-phenylenediamine, m-xylenediamine, diaminodiphenylsulfone, dicyandiamide, urea, urea derivatives, melamine, and polybasic hydrazide; organic acid salts or epoxy adducts thereof; amine complexes of boron trifluoride; and triazine derivatives such as ethyldiamino-s-triazine, 2,4-diamino-s-triazine, and 2,4-diamino-6-xylyl-s-triazine. These compounds may be used singly or in a combination of two or more.

When such an epoxy resin curing agent is used concomitantly, its content is preferably 0.01 to 30% by mass, more preferably 0.1 to 20% by mass based on the total solid content of the photosensitive resin composition from the viewpoint of Enhancing the Reliability <(C) Photopolymerization Initiator>

There is no particular limitation on the component (C) for use in this embodiment as long as it can polymerize a photopolymerizable compound contained in the photosensitive resin composition of this embodiment, and it may be appropriately selected from commonly used photopolymerization initiators.

Either a single compound or a combination of two or more compounds may be used as the component (C).

Examples of the component (C) include benzoin photopolymerization initiators such as benzoin, benzoin methyl ether, and benzoin isopropyl ether; alkylphenone photopolymerization initiators such as acetophenone, 2,2-dimethoxy-2-phenylacetophenone, 2,2-diethoxy-2-phenylacetophenone, 1,1-dichloroacetophenone, 1-hydroxycyclohexylphenyl ketone, 2-benzyl dimethylamino-1-(4-morpholinophenyl)-butanone-1,2-methyl-1-[4-(methylthio) phenyl]-2-morpholino-1-propanone, and N,N-dimethylaminoacetophenone; anthraquinone photopolymerization initiators such as 2-methylanthraquinone, 2-ethylanthraquinone, 2-tert-butylanthraquinone, 1-chloroanthraquinone, 2-amylanthraquinone and 2-aminoanthraquinone; thioxanthone photopolymerization initiators having a thioxanthone skeleton, such as 2,4-dimethylthioxanthone, 2,4-diethylthioxanthone, 2-chlorothioxanthone, and 2,4-diisopropylthioxanthone; ketal photopolymerization initiators such as acetophenone dimethyl ketal and benzyl dimethyl ketal; benzophenone photopolymerization initiators such as benzophenone, methylbenzophenone, 4,4'-dichlorobenzophenone, 4,4'-bis(diethylamino)benzophenone, Michler's ketone, and 4-benzoyl-4'-methyldiphenyl sulfide; acridine photopolymerization initiators such as 9-phenylacridine and 1,7-bis(9,9'-acridinyl)heptane; acylphosphine oxide photopolymerization initiators such as 2,4,6-trimethylbenzoyldiphenylphosphine oxide; and oxime ester photopolymerization initiators such as 1,2-octanedione-1-[4-(phenylthio)phenyl]-2-(O-benzoyloxime), 1-[9-ethyl-6-(2-methylbenzoyl)-9H-carbazol-3-yl]ethanone 1-(O-acetyloxime), and 1-phenyl-1,2-propanedione-2-[O-(ethoxycarbonyl) oxime].

Among them, at least one selected from the group consisting of an alkylphenone photopolymerization initiator, a thioxanthone photopolymerization initiator having a thioxanthone skeleton, a benzophenone photopolymerization initiator, an oxime ester photopolymerization initiator, and an acylphosphine oxide photopolymerization initiator is preferred.

The component (C) may be selected depending on the intended performance. For example, the component (C) is preferably selected from acylphosphine oxide photopolymerization initiators from the viewpoint of enhancing the curability of a bottom portion of a resist pattern through photobleaching. The component (C) is preferably selected from alkylphenone photopolymerization initiators from the viewpoint of being hardly volatile and thus hard to outgas. An acetophenone is preferred as an alkylphenone photopolymerization initiator.

Alkylphenone photopolymerization initiators can be classified into benzyl ketals having a benzyl ketal structure, α-hydroxyalkylphenones having a hydroxy group at the α-position of the carbonyl group, and α-aminoalkylphenones having a nitrogen atom at the α-position of the carbonyl group. Among them, α-aminoalkylphenones are preferred.

(Content of Component (C))

While there is no particular limitation on the content of the component (C) in the photosensitive resin composition of this embodiment, it is preferably 0.2 to 15% by mass, more preferably 0.4 to 5% by mass, and even more preferably 0.6 to 1.5% by mass based on the total solid content of the photosensitive resin composition. When the content of the component (C) is within the above range, an exposed area tends to be hardly soluble during development. Further, when the content of the component (C) is equal to or lower than the upper limit, the photosensitive resin composition tends to be excellent in the heat resistance.

In addition to the component (C), the photosensitive resin composition of this embodiment may also contain a photopolymerization initiator aid which is, for example, a tertiary amine such as N,N-dimethylaminobenzoic acid ethyl ester, N,N-dimethylaminobenzoic acid isoamyl ester, pentyl-4-dimethylaminobenzoate, triethylamine, or triethanolamine. These compounds may be used singly or in a combination of two or more.

<(D) Photopolymerizable Compound>

The component (D) for use in this embodiment is a polyfunctional monomer which has a skeleton (X) derived from a polyhydric alcohol and having three or more bonding groups (a), each corresponding to a hydroxy group from which the hydrogen atom has been removed, and which has three or more (meth)acryloyl groups bonded directly or indirectly to the bonding groups (a), with at least one (meth)acryloyl group of the three or more (meth)acryloyl groups being bonded to the bonding group(s) (a) via a linking group.

Owing to the inclusion of the component (D), the photosensitive resin composition of this embodiment tends to be significantly improved in the degree of elongation and the tensile strength against an external stress of the cured product, be excellent in the heat resistance and the thermal shock resistance, and be unlikely to exhibit a reduction in the insulating properties on a HAST test while maintaining good resolution.

The component (D) differs from the component (A) in that an acid substituent is not essential. Further, the component (D) preferably does not have a carboxy group, a sulfonic acid group or a phenolic hydroxy group, and may be one having no acid substituent.

Either a single compound or a combination of two or more compounds may be used as the component (D).

The skeleton (X) that the component (D) has is derived from a polyhydric alcohol.

The number of hydroxy groups that the polyhydric alcohol, which provides the skeleton (X), has in one molecule is preferably 3 to 10, more preferably 4 to 9, and even more preferably 5 to 8.

Examples of the polyhydric alcohol include glycerin, diglycerin, trimethylolpropane, ditrimethylolpropane, pentaerythritol, and dipentaerythritol. Among them, dipentaerythritol is preferred from the viewpoint of enhancing the sensitivity.

The skeleton (X) has the three or more bonding groups (a) each corresponding to a hydroxy group which has been contained in the polyhydric alcohol and from which the hydrogen atom has been removed. Thus, the skeleton (X) can be expressed as a trivalent or higher group having three or more oxygen atoms, each corresponding to an alcoholic hydroxy group which has been contained in the polyhydric alcohol and from which the hydrogen atom has been removed, as bonding groups each bonded to another structure.

Part or all of the hydroxy groups of the polyhydric alcohol may provide the bonding groups (a); however, it is preferred that all the hydroxy groups provide the bonding groups (a) from the viewpoint of flexibility and thermal shock resistance.

The number of the bonding groups (a) of the skeleton (X) is preferably 3 to 10, more preferably 4 to 9, and even more preferably 5 to 8 from the viewpoint of resolution, flexibility, heat resistance, thermal shock resistance, and insulating properties.

The skeleton (X) is preferably represented by the following general formula (D-1):

$$X^d \leftarrow\!\!\!\left( O \right)_p\!\!- * \qquad \text{(D-1)}$$

where $X^d$ represents an organic group, p represents the number of —O— groups bonded to $X^d$, which is an integer of 3 to 10, and * is a bonding site to another structure.

In the general formula (D-1), the number of carbon atoms of the organic group represented by $X^d$ is preferably 3 to 20, more preferably 5 to 15, and even more preferably 8 to 12.

$X^d$ corresponds to a residue of a polyhydric alcohol from which the hydroxy groups have been removed, and the —O— group is a bonding group (a) corresponding to a hydroxy group from which the hydrogen atom has been removed. Thus, the skeleton (X) represented by the general formula (D-1) can also be expressed as a p-valent bonding group. The polyhydric alcohol has been described above.

P is an integer of 3 to 10, and is preferably an integer of 4 to 8, more preferably an integer of 5 to 7 from the viewpoint of resolution, flexibility, heat resistance, thermal shock resistance, and insulating properties.

In the component (D), at least one (meth)acryloyl group is bonded to the bonding group(s) (a) via a linking group.

Only part of the three or more (meth)acryloyl groups contained in the component (D) may be bonded to the bonding group(s) (a) via a linking group; however, it is preferred that all the (meth)acryloyl groups be bonded to the bonding groups (a) via a linking group. A (meth)acryloyl group(s), which is bonded to the skeleton (X) not via a linking group, is preferably bonded directly to the bonding group(s) (a).

The number of the (meth)acryloyl groups, contained in the component (D) and bonded to the bonding groups (a) via the linking group, may be 1 or more, and is preferably 3 to 10, more preferably 4 to 8, and even more preferably 5 to 7 from the viewpoint of resolution, flexibility, heat resistance, thermal shock resistance, and insulating properties.

The linking group contained in the component (D) is preferably a divalent organic group having at least one carbon atom and, from the viewpoint of resolution, flexibility, heat resistance, thermal shock resistance, and insulating properties, is more preferably a divalent organic group having 2 to 10 carbon atoms, and even more preferably a divalent organic group having 3 to 7 carbon atoms.

The linking group is preferably a divalent group comprising an alkylene oxide structural unit, or a divalent group derived from a hydroxy acid from the viewpoint of resolution, flexibility, heat resistance, thermal shock resistance, and insulating properties.

The alkylene oxide structural unit in the divalent group comprising an alkylene oxide structural unit is preferably an alkylene oxide structural unit having 2 to 4 carbon atoms, more preferably an ethylene oxide structural unit or a propylene oxide structural unit, and even more preferably an ethylene oxide structural unit from the viewpoint of resolution, flexibility, heat resistance, thermal shock resistance, and insulating properties.

The number of alkylene oxide structural units in the divalent group comprising an alkylene oxide structural unit is preferably 1 to 5, more preferably 2 to 4, and even more preferably 2 or 3 from the viewpoint of resolution, flexibility, heat resistance, thermal shock resistance, and insulating properties.

The divalent group comprising an alkylene oxide structural unit is preferably represented by the following general formula (D-2):

$$*^A\text{—}(R^{d1}\text{—}O)_q\text{—}*^B \qquad \text{(D-2)}$$

where $R^{d1}$ is an alkylene group having 2 to 4 carbon atoms, q is a number of 1 to 5, *A is a moiety bonded to a bonding group (a) of the skeleton (X), and *B is a moiety bonded to a (meth)acryloyl group.

The alkylene group having 2 to 4 carbon atoms, represented by $R^{d1}$, is for example an ethylene group, a propylene group, or a butylene group.

q is a number of 1 to 5 and, from the viewpoint of resolution, flexibility, heat resistance, thermal shock resistance, and insulating properties, is preferably a number of 2 to 4, more preferably a number of 2 or 3.

The divalent group derived from a hydroxy acid has a bonding group obtained by removing hydrogen from the hydroxy group of the hydroxy acid, and a bonding group obtained by removing an OH group from the carboxy group of the hydroxy acid.

The divalent group derived from a hydroxy acid is preferably a divalent group derived from an aliphatic hydroxy acid. The number of carbon atoms of the aliphatic hydroxy acid is preferably 2 to 10, more preferably 3 to 8, and even more preferably 4 to 7 from the viewpoint of resolution, flexibility, heat resistance, thermal shock resistance, and insulating properties.

Examples of the hydroxy acid include glycolic acid, hydroxypropionic acid, hydroxybutanoic acid, hydroxypentanoic acid, hydroxyhexanoic acid, hydroxyheptanoic acid, hydroxynonanoic acid, hydroxydecanoic acid, hydroxyundecanoic acid, hydroxydodecanoic acid, hydroxytridecanoic acid, hydroxytetradecanoic acid, hydroxypentadecanic acid, hydroxyhexadecanoic acid, hydroxyheptadecanoic acid, hydroxyoctadecanoic acid, and hydroxynonadecanoic acid.

The divalent group derived from a hydroxy acid is preferably one represented by the following general formula (D-3):

$$*^A\text{—}(\overset{\displaystyle O}{\overset{\|}{C}}H\text{—}R^{d2}\text{—}O)_r\text{—}*^B \qquad \text{(D-3)}$$

where $R^{d2}$ is a divalent aliphatic hydrocarbon group having 1 to 9 carbon atoms, r is a number of 1 to 5, *A is a moiety bonded to a bonding group (a) of the skeleton (X), and *B is a moiety bonded to a (meth)acryloyl group.

The number of carbon atoms of the aliphatic hydrocarbon group represented by $R^{d2}$ is 1 to 9, preferably 2 to 7, and more preferably 3 to 6 from the viewpoint of resolution, flexibility, heat resistance, thermal shock resistance, and insulating properties.

Examples of the aliphatic hydrocarbon group represented by $R^{d2}$ include an alkylene group such as a methylene group, an ethylene group, a propylene group, a trimethylene group, a butylene group, a tetramethylene group, a pentamethylene group, a hexamethylene group, a heptamethylene group, or a nonamethylene group; an alkylidene group; an alkenylene group; and an alkynylene group. Among these, an alkylene group is preferred.

r is a number of 1 to 5, and is preferably a number of 1 or 2, more preferably 1 from the viewpoint of resolution, flexibility, heat resistance, thermal shock resistance, and insulating properties.

The component (D) is preferably a compound represented by the following general formula (D-4):

$$(Z^{d1}-O)_s-X^{d}-(O-Y^{d}-Z^{d2})_t \quad (D\text{-}4)$$

where $X^d$ has the same meaning as the above-described $X^d$ in the general formula (D-1), $Y^d$ represents a linking group represented by the general formula (D-2) or (D-3), $Z^{d1}$ and $Z^{d2}$ each independently represent a (meth)acryloyl group, s represents an integer of 0 to 9, t represents an integer of 1 to 10, and the sum of s and t is an integer of 3 to 10.

In the general formula (D-4), s is an integer of 0 to 9, and is preferably an integer of 0 to 3, more preferably 0 from the viewpoint of resolution, flexibility, heat resistance, thermal shock resistance, and insulating properties.

t is an integer of 1 to 10 and, from the same viewpoints, is preferably an integer of 4 to 8, more preferably an integer of 5 to 7.

The sum of s and t is an integer of 3 to 10 and, from the same viewpoints, is preferably an integer of 4 to 8, more preferably an integer of 5 to 7.

(Content of Component (D))

While there is no particular limitation on the content of the component (D) in the photosensitive resin composition of this embodiment, it is preferably 1 to 15% by mass, more preferably 2 to 10% by mass, and even more preferably 3 to 7% by mass based on the total solid content of the photosensitive resin composition. When the content of the component (D) is equal to or higher than the lower limit, the photosensitive resin composition tends to have an enhanced photosensitivity, and therefore an exposed area is hardly dissolved during development. When the content of the component (D) is equal to or lower than the upper limit, the photosensitive resin composition tends to be excellent in the heat resistance. Further, when the content of the component (D) is within the above range, the photosensitive resin composition more tends to be significantly improved in the degree of elongation and the tensile strength against an external stress of the cured product, be excellent in the heat resistance and the thermal shock resistance, and be unlikely to exhibit a reduction in the insulating properties on a HAST test while maintaining good resolution.

The photosensitive resin composition of this embodiment may optionally further contain a photopolymerizable compound other than the components (A) and (D).

Examples of the photopolymerizable compound other than the components (A) and (D) include hydroxyalkyl (meth)acrylates such as 2-hydroxyethyl (meth)acrylate and 2-hydroxypropyl (meth)acrylate; mono- or di(meth)acrylates of a glycol such as ethylene glycol, methoxytetraethylene glycol, polyethylene glycol, or hexanediol, or an ethylene oxide or propylene oxide adduct thereof; (meth) acrylamides such as N,N-dimethyl(meth)acrylamide and N-methylol(meth)acrylamide; aminoalkyl (meth)acrylates such as N,N-dimethylaminoethyl (meth)acrylate; multi(meth)acrylates of a polyhydric alcohol such as trimethylolpropane, pentaerythritol, ditrimethylolpropane, dipentaerythritol, or tris-hydroxyethyl isocyanurate; (meth) acrylates of an ethylene oxide or propylene oxide adduct of a phenol, such as phenoxyethyl (meth)acrylate and polyethoxydi(meth)acrylate of bisphenol A; (meth)acrylates of a glycidyl ether such as glycerin diglycidyl ether or triglycidyl isocyanurate; and melamine (meth)acrylate. These compounds may be used singly or in a combination of two or more. The photopolymerizable compound other than the components (A) and (D) preferably has a molecular weight of 1,000 or less from the viewpoint of photosensitivity.

<(E) Inorganic Filler>

The photosensitive resin composition of this embodiment may further contain the component (E) from the viewpoint of further enhancing properties such as adhesion strength and coating hardness.

Either a single filler or a combination of two or more fillers may be used as the component (E).

Examples of the component (E) include silica ($SiO_2$), alumina ($Al_2O_3$), titania ($TiO_2$), tantalum oxide ($Ta_2O_5$), zirconia ($ZrO_2$), silicon nitride ($Si_3N_4$), barium titanate ($BaO \cdot TiO_2$), barium carbonate ($BaCO_3$), magnesium carbonate ($MgCO_3$), aluminum hydroxide ($Al(OH)_3$), magnesium hydroxide ($Mg(OH)_2$), lead titanate ($PbO \cdot TiO_2$), lead zirconate titanate (PZT), lead lanthanum zirconate titanate (PLZT), gallium oxide ($Ga_2O_3$), spinel ($MgO \cdot Al_2O_3$), mullite ($3Al_2O_3 \cdot 2SiO_2$), cordierite ($2MgO \cdot 2Al_2O_3/5SiO_2$), talc ($3MgO \cdot 4SiO_2 \cdot H_2O$), aluminum titanate ($TiO_2 \cdot Al_2O_3$), yttria-containing zirconia ($Y_2O_3 \cdot ZrO_2$), barium silicate ($BaO \cdot 8SiO_2$), boron nitride (BN), calcium carbonate ($CaCO_3$), barium sulfate ($BaSO_4$), calcium sulfate ($CaSO_4$), zinc oxide (ZnO), magnesium titanate ($MgO \cdot TiO_2$), hydrotalcite, mica, calcined kaolin, and carbon (C).

The photosensitive resin composition may contain silica as the component (E) from the viewpoint of enhancing the heat resistance, may contain barium sulfate from the viewpoint of enhancing the heat resistance and the adhesion strength, and may contain a combination of silica and barium sulfate. An inorganic filler which has been surface-treated with alumina or an organosilane compound may be appropriately selected from the viewpoint of enhancing dispersion of the inorganic filler in the photosensitive resin composition due to the aggregation preventing effect of the surface treatment.

The elemental composition of aluminum at the surface of the inorganic filler surface-treated with alumina or an organosilane compound may be appropriately selected from 0.5 to 10 atom %, 1 to 5 atom %, and 1.5 to 3.5 atom %. The elemental composition of silicon at the surface of the inorganic filler may be appropriately selected from 0.5 to 10 atom %, 1 to 5 atom %, and 1.5 to 3.5 atom %. The elemental composition of carbon at the surface of the inorganic filler may be appropriately selected from 10 to 30 atom %, 15 to 25 atom %, and 18 to 23 atom %. Such an elemental composition can be measured by XPS (X-ray photoelectron spectroscopy).

NanoFine BFN40DC (trade name, manufactured by Nippon Solvay Co., Ltd.), which is barium sulfate surface-treated with alumina or an organosilane compound, is an exemplary commercially available inorganic filler surface-treated with alumina or an organosilane compound.

The average particle size of the component (E) is preferably 0.01 to 5 μm, more preferably 0.05 to 3 μm, even more preferably 0.1 to 2 μm, and especially preferably 0.15 to 1 μm from the viewpoint of resolution.

The average particle size of the component (E) herein refers to an average particle size of inorganic filler particles dispersed in the photosensitive resin composition, and can be determined in the following manner.

First, after diluting the photosensitive resin composition 1,000 times with methyl ethyl ketone, particles dispersed in the solvent are measured by using a submicron particle analyzer (trade name: $N_5$, manufactured by Beckman Coulter) with a refractive index of 1.38 in accordance with the international standard ISO 13321, and a particle size at a 50% integrated value (volume basis) in the particle size distribution is taken as the average particle size. Also for the component (E) contained in a photosensitive layer provided on a carrier film or contained in a cured film of the photosensitive resin composition, the average particle size of the component (E) can be measured by diluting (or dissolving) the layer or film 1,000 times (volume ratio) with a solvent as described above, followed by measurement using the above submicron particle analyzer.

(Content of Component (E))

When the photosensitive resin composition of this embodiment contains the component (E), its content is not particularly limited; however, it is preferably 20 to 70% by mass, more preferably 25 to 65% by mass, and even more preferably 28 to 60% by mass based on the total solid content of the photosensitive resin composition. When the content of the component (E) is within the above range, the photosensitive resin composition tends to be excellent in the strength of the cured product, the heat resistance, the resolution, etc.

When silica is used as the component (E), the content of the silica is not particularly limited; however, it is preferably 5 to 60% by mass, more preferably 10 to 55% by mass, and even more preferably 15 to 50% by mass based on the total solid content of the photosensitive resin composition.

When barium sulfate is used as the component (E), the content of the barium sulfate is not particularly limited; however, it is preferably 5 to 30% by mass, more preferably 5 to 25% by mass, and even more preferably 10 to 20% by mass based on the total solid content of the photosensitive resin composition.

When the content of silica or barium sulfate is within the above range, the photosensitive resin composition tends to be excellent in the low coefficient of thermal expansion, the resistance to soldering heat, the adhesion strength, etc.

<(F) Pigment>

The photosensitive resin composition of this embodiment may further contain a pigment (F) of a desired color from an appearance viewpoint, such as concealment of a conductor pattern.

Either a single pigment or a combination of two or more pigments may be used as the component (F).

A colorant, which produces a desired color, may be appropriately selected and used as the pigment (F). Examples of preferred pigments include known colorants such as phthalocyanine blue, phthalocyanine green, iodine green, diazo yellow, crystal violet, titanium oxide, carbon black, and naphthalene black.

(Content of Component (F))

When the photosensitive resin composition of this embodiment contains the component (F), its content is not particularly limited; however, it is preferably 0.01 to 5% by mass, more preferably 0.03 to 3% by mass, and even more preferably 0.05 to 2% by mass based on the total solid content of the photosensitive resin composition from the viewpoint of facilitating discrimination of a production apparatus and further concealing a conductor pattern.

<(G) Ion Scavenger>

The photosensitive resin composition of this embodiment may further contain an ion scavenger (G) from the viewpoint of the shape of a resist, adhesion, fluidity, and reliability.

The "ion scavenger" refers to a substance capable of capturing ions in it, and is not particularly limited as long as it functions to capture at least one of cations and anions. Ions to be captured in this embodiment are, for example, sodium ions ($Na^+$), chloride ions ($Cl^-$), bromide ion ($Br^-$), and copper ions ($Cu^+$, $Cu^{2+}$), which are incorporated into the composition that reacts by irradiation with light, electron beam, or the like and changes its solubility in a solvent. By capturing such ions, the electrical insulating properties, the electrical corrosion resistance, etc. of the photosensitive resin composition can be enhanced.

Either a single scavenger or a combination of two or more scavengers may be used as the component (G).

The component (G) is preferably an ion scavenger comprising at least one selected from the group consisting of Zr (zirconium), Bi (bismuth), Mg (magnesium), and Al (aluminum).

The component (G) includes a cation scavenger that captures cations, an anion scavenger that captures anions, and an amphoteric scavenger that captures cations and anions.

(Cation Scavenger)

Examples of the cation scavenger that captures cations include inorganic ion exchangers of a metal oxide such as zirconium phosphate, zirconium tungstate, zirconium molybdate, zirconium tungstate, zirconium antimonate, zirconium selenate, zirconium tellurate, zirconium silicate, zirconium phosphosilicate, or zirconium polyphosphate.

(Anion Scavenger)

Examples of the anion scavenger that captures anions include inorganic ion exchangers such as bismuth oxide hydrate and hydrotalcite.

(Amphoteric Scavenger)

Examples of the amphoteric scavenger that captures cations and anions include inorganic ion exchangers of a hydrous metal oxide such as aluminum oxide hydrate or zirconium oxide hydrate. Further, IXE-1320 (compound containing Mg and Al), IXE-600 (compound containing Bi), IXE-633 (compound containing Bi), IXE-680 (compound containing Bi), IXE-6107 (compound containing Zr and Bi), IXE-6136 (compound containing Zr and Bi), IXEPLAS-Al (compound containing Zr, Mg, and Al), IXEPLAS-A2 (compound containing Zr, Mg, and Al), and IXEPLAS-B1 (compound containing Zr and Bi), which are commercially available from Toagosei Co., Ltd., can also be used as the amphoteric scavenger (which can also be referred to as "inorganic ion exchanger").

An ion scavenger in a particulate form can be used as the component (G). The average particle size of the component (G) is preferably 5 μm or less, more preferably 3 μm or less, and even more preferably 2 μm or less from the viewpoint of enhancing the insulating properties, while it is preferably 0.1 μm or more. The average particle size of the component (G) herein refers to an average particle size of particles dispersed in the photosensitive resin composition, and can be measured by the same method as the above-described method for measuring the average particle size of the component (E).

(Content of Component (G))

When the photosensitive resin composition of this embodiment contains the component (G), its content is not particularly limited; however, it is preferably 0.05 to 10% by mass, more preferably 0.1 to 5% by mass, and even more preferably 0.2 to 1% by mass based on the total solid content of the photosensitive resin composition from the viewpoint of enhancing the electrical insulating properties and the electrical corrosion resistance.

<(H) Elastomer>

The photosensitive resin composition of this embodiment may further contain an elastomer as a component (H). The component (H) can be advantageously used especially when the photosensitive resin composition of this embodiment is used in a semiconductor package substrate. The use of the component (H) can prevent a reduction in the flexibility and the adhesive strength due to a strain (internal stress) within the resin caused by curing shrinkage of the component (A).

Thus, the use of the component (H) can enhance the flexibility and the adhesive strength of a cured film formed from the photosensitive resin composition.

The component (H) is exemplified by a styrene elastomer, an olefin elastomer, a urethane elastomer, a polyester elastomer, a polyamide elastomer, an acrylic elastomer, and a silicone elastomer.

Among them, an olefin elastomer and a polyester elastomer are preferred.

An epoxy-modified polybutadiene (hereinafter also referred to as an "epoxylated polybutadiene") may be used as the olefin elastomer.

The epoxy-modified polybutadiene preferably has a hydroxy group at a molecular end(s), more preferably has hydroxy groups at both ends of the molecule, and even more preferably has hydroxy groups only at both ends of the molecule. While there is no particular limitation on the number of hydroxy groups in the epoxy-modified polybutadiene as long as it is at least 1, it is preferably 1 to 5, more preferably 1 or 2, and even more preferably 2.

The epoxy-modified polybutadiene is preferably an epoxy-modified polybutadiene represented by the following general formula (H-1) from the viewpoint of adhesion to an inner-layer circuit, heat resistance, thermal expansion coefficient, and flexibility:

(H-1)

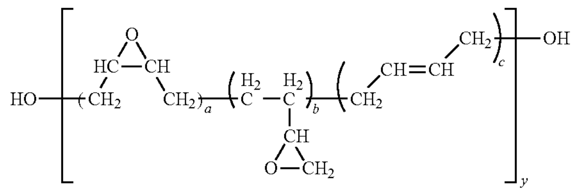

where a, b and c each represent the proportion of the structural unit in parentheses, a is 0.05 to 0.40, b is 0.02 to 0.30, c is 0.30 to 0.80, a+b+c=1.00, (a+c)>b, and y represents the number of the structural units in square brackets and is an integer of 10 to 250.

In the general formula (H-1), the respective structural units in square brackets are bonded in random order. Thus, the left-hand structural unit, the middle structural unit and the right-hand structural unit may be interchanged. The following are examples of possible manners of bonding between the three types of structural units: -[(a)-(b)-(c)]-[(a)-(b)-(c)-]-, -[(a)-(c)-(b)]-[(a)-(c)-(b)-]-, -[(a)-(a)-(c)]-[(b)-(a)-(c)-]-, -[(a)-(b)-(c)]-[(c)-(b)-(a)-]-, -[(a)-(b)-(a)]-[(c)-(b)-(c)-]-, -[(c)-(b)-(c)]-[(b)-(a)-(a)-]-, etc., where (a), (b) and (c) represent the left-hand structural unit, the middle structural unit and the right-hand structural unit, respectively.

a is preferably 0.10 to 0.30, b is preferably 0.10 to 0.30, and c is preferably 0.40 to 0.80 from the viewpoint of adhesion to an inner-layer circuit, heat resistance, thermal expansion coefficient, and flexibility. From the same viewpoints, y is preferably an integer of 30 to 180.

"EPOLEAD (registered trademark) PB3600" (manufactured by Daicel Corporation) is an exemplary commercially available epoxylated polybutadiene represented by the general formula (H-1) where a=0.20, b=0.20, c=0.60, and y=10 to 250.

The polyester elastomer includes those obtained by polycondensation of a dicarboxylic acid or a derivative thereof and a diol compound or a derivative thereof. Specific examples of the dicarboxylic acid include an aromatic dicarboxylic acid such as terephthalic acid, isophthalic acid, or naphthalenedicarboxylic acid, and an aromatic dicarboxylic acid in which a hydrogen atom(s) of the aromatic nucleus is substituted with a methyl group, an ethyl group, a phenyl group or the like; an aliphatic dicarboxylic acid having 2 to 20 carbon atoms, such as adipic acid, sebacic acid, or dodecanedicarboxylic acid; and an alicyclic dicarboxylic acid such as cyclohexanedicarboxylic acid.

Specific examples of the diol compound include an aliphatic or alicyclic diol such as ethylene glycol, 1,3-propanediol, 1,4-butanediol, 1,6-hexanediol, 1,10-decanediol or 1,4-cyclohexanediol; and a dihydric phenol represented by the following general formula (H-2):

(H-2)

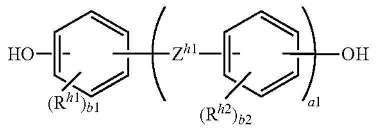

where $Z^{h1}$ represents an alkylene group having 1 to 10 carbon atoms, a cycloalkylene group having 4 to 8 carbon atoms, —O—, —S—, or —$SO_2$—, or direct bonding between benzene rings, $R^{h1}$ and $R^{h2}$ are each independently a hydrogen atom, a halogen atom, or an alkyl group having 1 to 12 carbon atoms, b1 and b2 are each independently an integer of 0 to 4, a1 is 0 or 1, and the alkylene group and the cycloalkylene group may be linear or branched and may be substituted with a halogen atom, an alkyl group, an aryl group, an aralkyl group, an amino group, an amide group, an alkoxy group, or the like.

Examples of the dihydric phenol represented by the general formula (H-2) include bisphenol A, bis-(4-hydroxyphenyl)methane, bis-(4-hydroxy methylphenyl)propane, and resorcin. These compounds may be used singly or in a combination of two or more.

It is also possible to use a multi-block copolymer comprising an aromatic polyester (e.g., polybutylene terephthalate) moiety as a hard segment component, and an aliphatic polyester (e.g., polytetramethylene glycol) moiety as a soft segment component. There are multi-block copolymers of various grades depending on the types of the hard segment and the soft segment, the ratio between the segments, and a difference in molecular weight between the segments. Commercially available products of such copolymers include Hytrel (manufactured by Du Pont-Toray Co., Ltd.), Pelprene (manufactured by Toyobo Co., Ltd.), and Espel (manufactured by Hitachi Chemical Co., Ltd.).

(Content of Component (H))

When the photosensitive resin composition of this embodiment contains the component (H), its content is not particularly limited; however, it is preferably 2 to 40 parts by mass, more preferably 4 to 30 parts by mass, even more preferably 6 to 20 parts by mass and especially preferably 10 to 15 parts by mass per 100 parts by mass of the component (A) (solid content). When the content of the component (H) is within the above range, the modulus of elasticity of the cured film in a high temperature range is likely to decrease, and an unexposed area is more easily dissolved in a developer.

<Diluent>

The photosensitive resin composition of this embodiment may contain a diluent as necessary.

The diluent may be an organic solvent. Examples of the organic solvent include ketones such as methyl ethyl ketone and cyclohexanone; aromatic hydrocarbons such as toluene, xylene and tetramethylbenzene; glycol ethers such as methyl cellosolve, butyl cellosolve, methyl carbitol, butyl carbitol, propylene glycol monomethyl ether, dipropylene glycol monoethyl ether, dipropylene glycol diethyl ether, and triethylene glycol monoethyl ether; esters such as ethyl acetate, butyl acetate, butyl cellosolve acetate, and carbitol acetate; aliphatic hydrocarbons such as octane and decane; and petroleum solvents such as petroleum ether, petroleum naphtha, hydrogenated petroleum naphtha, and solvent naphtha.

When the diluent is used, its amount may be appropriately selected from amounts that preferably make the total solid content of the photosensitive resin composition 50 to 90% by mass, more preferably 60 to 80% by mass, and even more preferably 65 to 75% by mass. In other words, when the photosensitive resin composition of this embodiment contains the diluent, its content is preferably 10 to 50% by mass, more preferably 20 to 40% by mass, and even more preferably 25 to 35% by mass. When the content of the diluent is within the above range, the coating properties of the photosensitive resin composition are enhanced. This enables the formation of a finer pattern. It is to be noted, however, that the photosensitive resin composition of this embodiment may be one containing no diluent.

<Other Additives>

The photosensitive resin composition of this embodiment may optionally contain known conventional additives including a polymerization inhibitor such as hydroquinone, methylhydroquinone, hydroquinone monomethyl ether, catechol, or pyrogallol; a thickener such as bentone or montmorillonite; an antifoaming agent such as a silicone, fluorine or vinyl resin antifoaming agent; a silane coupling agent; and a flame retardant such as a brominated epoxy compound, an acid-modified brominated epoxy compound, an antimony compound, a phosphate compound, an aromatic condensed phosphate ester, or a halogen-containing condensed phosphate ester. These compounds may be used singly or in a combination of two or more. The photosensitive resin composition of this embodiment may be one which does not contain any such other additive.

<Method for Producing Photosensitive Resin Composition>

The photosensitive resin composition of this embodiment can be produced e.g. by mixing and kneading the above-described components. An apparatus such as a roll mill or a bead mill, for example, can be used for performing the mixing.

The photosensitive resin composition of this embodiment is suited for the formation of a pattern and the formation of vias [hereinafter sometimes referred to as photo-via formation] by photolithography. Therefore, the present invention also provides a photosensitive resin composition for the formation of a permanent mask resist and a photosensitive resin composition for photo-via formation, comprising the photosensitive resin composition of this embodiment. In addition, the photosensitive resin composition of this embodiment is excellent in the resolution, the adhesion to an inner-layer circuit, and the reliability of electrical insulation, and thus is useful as an interlayer insulating layer of a multi-layer printed wiring board. Therefore, the present invention also provides a photosensitive resin composition for an interlayer insulating layer, comprising the photosensitive resin composition of this embodiment.

[Dry Film]

The dry film of this embodiment includes a carrier film and a photosensitive layer using the photosensitive resin composition of this embodiment.

The thickness of the photosensitive layer of the dry film of this embodiment is preferably 5 to 50 μm, more preferably 15 to 40 μm, and even more preferably 20 to 30 μm.

Examples of the carrier film include polyesters such as polyethylene terephthalate and polybutylene terephthalate; and polyolefins such as polypropylene and polyethylene. The thickness of the carrier film may be appropriately selected from the range of 5 to 100 μm.

The dry film of this embodiment may further include a protective film provided on the surface of the photosensitive layer, opposite to the surface in contact with the carrier film. A polymer film such as polyethylene or polypropylene, for example, may be used as the protective film. The polymer film may be the same as or different from the above-described carrier film.

The dry film of this embodiment can be produced, for example, by applying the photosensitive resin composition of this embodiment onto a carrier film by a known method such as reverse roll coating, gravure roll coating, comma coating, or curtain coating, and drying the coating film to form a photosensitive layer.

The drying of the coating film can be performed by means of a drying machine using hot air, or far infrared or near infrared rays. The drying temperature may be appropriately selected from 60 to 120° C., 70 to 110° C., and 80 to 100° C. The drying time may be appropriately selected from 1 to 60 minutes, 2 to 30 minutes, and 5 to 20 minutes.

[Printed Wiring Board]

The printed wiring board of this embodiment is a printed wiring board having a surface protective film or an interlayer insulating layer formed from the photosensitive resin composition of this embodiment.

The surface protective film or the interlayer insulating layer, formed from the photosensitive resin composition of this embodiment, has flexibility with a high degree of elongation and has a high tensile strength against an external stress, is excellent in the heat resistance, the thermal shock resistance and the insulating properties, and has an excellent resist shape pattern.

Further, the surface protective film or the interlayer insulating layer has a pattern which is excellent in the stability of the formation of fine holes with a reduced pitch associated with the recent progress toward smaller-sized and higher-performance electronic devices.

While there is no particular limitation on the thickness of the surface protective film or the interlayer insulating layer, it is preferably 5 μm or more, more preferably 10 to 200 μm, even more preferably 15 to 150 μm, still more preferably 20 to 100 μm, and especially preferably 23 to 50 μm.

[Method for Producing Printed Wiring Board]

The method for producing a printed wiring board according to this embodiment comprises the sequential steps of providing a photosensitive layer on a substrate by using the photosensitive resin composition of this embodiment or the dry film of this embodiment; forming a resist pattern by using the photosensitive layer; and curing the resist pattern to form a surface protective film or an interlayer insulating layer.

The printed wiring board production method of this embodiment will now be described in more detail.

First, a photosensitive layer is provided on a metal-clad substrate either by applying the photosensitive resin composition of this embodiment onto the substrate or by laminating the photosensitive layer of the dry film of this embodiment, from which a protective film has been peeled off, to the substrate.

The application of the photosensitive resin composition may be performed, for example, by screen printing, spraying, roll coating, curtain coating, or electrostatic coating.

The application of the photosensitive resin composition is preferably performed such that the resulting photosensitive layer after drying preferably has a thickness of 5 μm or more, more preferably 10 to 200 μm, even more preferably 15 to 150 μm, still more preferably 20 to 100 μm, and especially preferably 23 to 50 μm. There is no particular limitation on conditions for drying after the application of the photosensitive resin composition; for example, the drying may be performed by heating the photosensitive resin composition at 60 to 110° C.

A thermal lamination process using a laminator can be used as a method for laminating the dry film to the substrate.

Next, a negative film is brought into direct contact with the thus formed photosensitive layer (or brought into indirect contact with the photosensitive layer via a transparent film such as a carrier film), and the photosensitive layer is irradiated with actinic light in an exposure amount appropriately selected from 10 to 2,000 mJ/cm$^2$, 100 to 1,500 mJ/cm$^2$, and 300 to 1,000 mJ/cm$^2$, and then an unexposed area is dissolved and removed (developed) with a dilute aqueous alkaline solution to form a resist pattern.

Examples of the active light include electron beam, ultraviolet rays, and X-rays, and ultraviolet rays are preferred. A low-pressure mercury lamp, a high-pressure mercury lamp, a super high-pressure mercury lamp, a halogen lamp, or the like can be used as a light source.

Next, the exposed area of the photosensitive layer is sufficiently cured by at least one of post-exposure (ultraviolet exposure) and post-heating to form a surface protective film or an interlayer insulating layer.

The exposure amount for the post-exposure may be appropriately selected from 100 to 5,000 mJ/cm$^2$, 500 to 2,000 mJ/cm$^2$, and 700 to 1,500 J/cm$^2$.

The heating temperature for the post-heating may be appropriately selected from 100 to 200° C., 120 to 180° C., and 135 to 165° C.

The heating time for the post-heating may be appropriately selected from 5 minutes to 12 hours, 10 minutes to 6 hours, and 30 minutes to 2 hours.

EXAMPLES

The following examples illustrate the present invention in greater detail and are not intended to limit the scope of the invention.

[Synthesis of Photopolymerizable Compound Having an Ethylenically Unsaturated Group and an Acid Substituent]

Synthesis Example 1: Synthesis of Acid-Modified Ethylenically Unsaturated Group-Containing Epoxy Derivative (A-1)

350 parts by mass of a bisphenol F novolac epoxy resin [component (a1)] ("EXA-7376", manufactured by DIC Corporation, a bisphenol F novolac epoxy resin containing a structural unit represented by the general formula (II) in which $Y^3$ and $Y^4$ are each a glycidyl group and $R^{12}$ is a hydrogen atom, epoxy equivalent weight: 186), 70 parts by mass of acrylic acid [component (b)], 0.5 parts by mass of methylhydroquinone, and 120 parts by mass of carbitol acetate were placed into a flask equipped with a stirrer, a reflux condenser, and a thermometer, and the mixture was allowed to react at 90° C. with stirring, whereby the mixture was completely dissolved.

Subsequently, the resulting solution was cooled to 60° C., and 2 parts by mass of triphenylphosphine was added to the solution, and the mixture was allowed to react at 100° C. until the acid value of the solution became 1 mgKOH/g or less.

98 parts by mass of tetrahydrophthalic anhydride (THPAC) [component (c)] and 85 parts by mass of carbitol acetate were added to the reaction solution, and the mixture was allowed to react at 80° C. for 6 hours.

Thereafter, the reaction solution was cooled to room temperature (25° C.) to obtain a THPAC-modified bisphenol F novolac epoxy acrylate (acid-modified ethylenically unsaturated group-containing epoxy derivative (A-1)) as a component (A1) (solid concentration: 73% by mass).

(Synthesis Example 2: Synthesis of Acid-Modified Ethylenically Unsaturated Group-Containing Epoxy Derivative (A-2))

1,052 parts by mass of a bisphenol F epoxy resin [component (a2)] (a bisphenol F epoxy resin containing a structural unit represented by the general formula (IV) in which $Y^6$ is a hydrogen atom and $R^{14}$ is a hydrogen atom, epoxy equivalent weight: 526), 144 parts by mass of acrylic acid [component (b)], 1 part by mass of methylhydroquinone, 850 parts by mass of carbitol acetate, and 100 parts by mass of solvent naphtha were placed into a flask equipped with a stirrer, a reflux condenser, and a thermometer, and the mixture was allowed to react at 70° C. with stirring, whereby the mixture was completely dissolved.

Subsequently, the resulting solution was cooled to 50° C., and 2 parts by mass of triphenylphosphine and 75 parts by mass of solvent naphtha were added to the solution, and the mixture was allowed to react at 100° C. until the acid value of the solution became 1 mgKOH/g or less.

The resulting solution was cooled to 50° C., and 745 parts by mass of tetrahydrophthalic anhydride (THPAC) [component (c)], 75 parts by mass of carbitol acetate, and 75 parts by mass of solvent naphtha were added to the solution after the reaction, and the mixture was allowed to react at 80° C. for 6 hours.

Thereafter, the reaction solution was cooled to room temperature (25° C.) to obtain a THPAC-modified bisphenol F epoxy acrylate (acid-modified ethylenically unsaturated group-containing epoxy derivative (A-2)) as a component (A2) (solid concentration: 62% by mass).

Synthesis Example 3: Acid-Modified Ethylenically Unsaturated Group-Containing Epoxy Derivative (A-3)

220 parts by mass of a cresol novolac epoxy resin [component (a1)] (trade name "YDCN 704," manufactured by Tohto Kasei Co., Ltd.), 72 parts by mass of acrylic acid [component (b)], 1.0 part by mass of hydroquinone, and 180 parts by mass of carbitol acetate were placed into a flask equipped with a stirrer, a reflux condenser, and a thermometer, and the mixture was allowed to react at 90° C. with stirring, whereby the mixture was completely dissolved.

Subsequently, the resulting solution was cooled to 60° C., and 1 part by mass of benzyltrimethylammonium chloride was added to the solution, and the mixture was allowed to react at 100° C. until the acid value of the solution became 1 mgKOH/g.

152 parts by mass of tetrahydrophthalic anhydride (THPAC) [component (c)] and 100 parts by mass of carbitol acetate were added to the solution after the reaction, and the mixture was allowed to react at 80° C. for 6 hours. Thereafter, the reaction solution was cooled to room temperature (25° C.) and diluted with carbitol acetate to obtain a THPAC-modified cresol novolac epoxy acrylate (acid-modified ethylenically unsaturated group-containing epoxy derivative (A-3)) (solid concentration: 60% by mass).

Examples 1 to 6 and Comparative Examples 1 to 4

(1) Production of Photosensitive Resin Composition

A mixture of components, having each of the compositions shown in Table 1 (the numerical values in the Table are in parts by weight, and any value for a solution represents a solid content), was kneaded in a three-roll mill. Thereafter, carbitol acetate was added to the kneaded product such that the solid concentration became 70% by mass to obtain a photosensitive resin composition.

(2) Production of Dry Film

The thus-obtained photosensitive resin composition was diluted with methyl ethyl ketone, and applied onto a polyethylene terephthalate film (trade name "G2-25", manufactured by Toyobo Co., Ltd., thickness 25 μm) as a carrier film such that the coating after drying had a thickness of 25 μm, followed by drying at 75° C. for 30 minutes using a hot-air convection dryer to form a photosensitive layer on the carrier film. Subsequently, a polyethylene film (trade name "NF-15", manufactured by Tamapoly Co., Ltd.) as a protective film was attached to the surface of the photosensitive layer, opposite to the surface in contact with the carrier film, to produce a dry film having the protective film.

[Evaluation Methods]

Properties of the photosensitive resin composition obtained in each Example were evaluated by the following methods.

(1. Evaluation of Resolution)

The protective film was peeled off from the dry film having the protective film produced in each Example, and the exposed photosensitive layer was laminated to a 0.6 mm-thick copper-clad substrate (trade name "MCL-E-67", manufactured by Hitachi Chemical Co., Ltd.) at 80° C. using a press-type vacuum laminator (trade name "MVLP-500", manufactured by Meiki Co., Ltd.) to obtain a laminate having the photosensitive layer with the carrier film.

Next, a negative mask having a predetermined opening pattern (opening size: 30, 40, 50, 60, 70, 80, 90, 100, 110, 120, 150, 200 μm) was brought into contact with the carrier film of the laminate, and exposure was performed using a UV exposure apparatus in such an exposure amount that the number of fully cured steps in a step tablet (manufactured by Hitachi Chemical Co., Ltd.) was 13.

Next, the carrier film was peeled off from the photosensitive layer, and the photosensitive layer was subjected to spray development at a pressure of $1.765\times10^5$ Pa for 60 seconds using 1 mass % aqueous sodium carbonate solution to dissolve and develop an unexposed area. Subsequently, the photosensitive layer was exposed in an exposure amount of 2,000 mJ/cm$^2$ using a UV exposure apparatus, followed by heating at 170° C. for one hour to produce a test specimen having the permanent mask resist with an opening pattern, formed on the copper-clad substrate.

The test specimen was observed with an optical microscope to determine the minimum opening size of the openings, and evaluated according to the following criteria:

<Evaluation Criteria>

A: The minimum opening size was 30 μm or less.

B: The minimum opening size was more than 30 μm and 50 μm or less.

C: The minimum opening size was more than 50 μm.

(2. Evaluation of the Shape of Resist Pattern)

The test specimen produced in "1. Evaluation of Resolution" above was cast with an embedding resin (using trade name "jER 828", manufactured by Mitsubishi Chemical Corporation, as an epoxy resin, and triethylenetetramine as a curing agent). After sufficiently curing the resin, the cast product was polished with a polishing machine (trade name "Refine Polisher", manufactured by Refine Tech Ltd.) to expose a cross section of the opening pattern of the permanent mask resist. The cross section of the opening pattern was observed with a metallurgical microscope and evaluated according to the following criteria.

<Evaluation Criteria>

A: Neither an undercut nor a defect in an upper portion of the resist was found, and the linearity of the contour of the pattern was good (see FIG. 1).

B: An undercut or a defect in an upper portion of the resist was found, or the linearity of the contour of the pattern was poor (see FIG. 2).

(3. Evaluation of Thermal Shock Resistance)

A temperature cycle test was performed on the test specimen produced in "1. Evaluation of Resolution" above, with 30 minutes at −65° C. and 30 minutes at 150° C. as one cycle. The test specimen was observed visually and with an optical microscope after 1000 cycles and 2000 cycles, and evaluated according to the following criteria.

<Evaluation Criteria>

A: No crack was found after 2000 cycles.

B: No crack was found after 1000 cycles, but a crack was found after 2000 cycles.

C: A crack was found after 1000 cycles.

(4. Evaluation of Heat Resistance)

The test specimen produced in "1. Evaluation of Resolution" above was placed in an environment at 150° C., and the test specimen was observed visually and with an optical microscope after 1000 hours and 2000 hours, and evaluated according to the following criteria.

<Evaluation Criteria>

A: No crack was found after 2000 hours.

B: No crack was found after 1000 hours, but a crack was found after 2000 hours.

C: A crack was found after 1000 hours.

(5. Evaluation of Insulating Properties)

A test specimen was produced in the same manner as described in "1. Evaluation of Resolution" above except that a bismaleimide triazine substrate having a comb electrode (line/space=10/10 μm) was used instead of the copper-clad substrate. The test specimen was exposed to the conditions of 135° C., 85% RH, and 3.3 V, and the change in the resistance value was measured with a migration tester (trade name "SIR13", manufactured by Kusumoto Chemicals, Ltd.). Thereafter, the occurrence of migration was observed with an optical microscope and evaluated according to the following criteria.

<Evaluation Criteria>

A: No migration occurred in the permanent mask resist and the resistance value did not decrease to $10^{-6}\Omega$ or less during a period of more than 200 hours.

B: No migration occurred in the permanent mask resist and the resistance value decreased to $10^{-6}\Omega$ or less during a period of 100 hours or more and less than 200 hours.

C: No migration occurred in the permanent mask resist and the resistance value decreased to $10^{-6}\Omega$ or less during a period of less than 100 hours.

(6. Evaluation of Degree of Elongation)

A negative mask having a pattern of rectangular openings with a length of 7 cm and a width of 1 cm was brought into contact with the carrier film-side surface of the dry film, produced in each Example, and exposure was performed using a UV exposure apparatus in such an exposure amount that the number of fully cured steps in a step tablet (manufactured by Hitachi Chemical Co., Ltd.) was 13. Thereafter, the protective film was peeled off from the photosensitive layer, and the photosensitive layer was subjected to spray development at a pressure of $1.765\times10^5$ Pa for 60 seconds using 1 mass % aqueous sodium carbonate solution to dissolve and develop an unexposed area. Subsequently, the photosensitive layer was exposed in an exposure amount of 2,000 $mJ/cm^2$ using a UV exposure apparatus, followed by heating at 170° C. for one hour. Thereafter, the carrier film was peeled off to produce a cured film consisting solely of the permanent mask resist having a length of 7 cm and a width of 1 cm.

Using the cured film as a test specimen, the degree of elongation was measured with a tensile tester under the conditions of 23° C. and a tensile speed of 1.0 mm/min according to JIS K 7127:1999, and evaluated according to the following criteria.

<Evaluation Criteria>

A: The degree of elongation at breakage of the cured film was 8% or more.

B: The degree of elongation at breakage of the cured film was 5% or more and less than 8%.

C: The degree of elongation at breakage of the cured film was less than 5%.

(7. Evaluation of Tensile Strength)

Using the cured film, produced in "6. Evaluation of Degree of Elongation" above, as a test specimen, the tensile strength was measured under the conditions of 23° C. and a tensile speed of 1.0 mm/min according to JIS K 7127:1999, and evaluated according to the following criteria.

A: The tensile strength at breakage of the cured film was 80 MPa or more.

B: The tensile strength at breakage of the cured film was 60 MPa or more and less than 80 MPa.

C: The tensile strength at breakage of the cured film was less than 60 MPa.

The results of the above-described evaluations are shown in Table 1.

TABLE 1

| | Component | | Example | | | | | | Comp. Example | | | |
|---|---|---|---|---|---|---|---|---|---|---|---|---|
| | | | 1 | 2 | 3 | 4 | 5 | 6 | 1 | 2 | 3 | 4 |
| Photosensitive resin composition | (A) | A-1 component (A1) | 21.9 | 21.9 | 21.9 | 21.9 | 21.9 | 21.9 | | | | 21.9 |
| | | A-2 component (A2) | 13.1 | 13.1 | 13.1 | 13.1 | 13.1 | 13.1 | | | | 13.1 |
| | | A-3 | | | | | | | 36.3 | 35.6 | 40.4 | |
| | (B) | YSLV-80XY | 8.7 | 8.7 | 8.7 | 8.7 | 8.7 | 8.7 | | | | 8.7 |
| | | RE-306 | 4.4 | 4.4 | 4.4 | 4.4 | 4.4 | 4.4 | | | | 4.4 |
| | | jER828 | | | | | | | 10.5 | 9.9 | 10.1 | |
| | | Melamine | | | | | | | 3.2 | 3.3 | 3.4 | |
| | (C) | C-1 | 0.9 | 0.9 | 0.9 | 0.9 | 0.9 | 0.9 | 3.6 | 3.7 | 3.8 | 0.9 |
| | | C-2 | 0.1 | 0.1 | 0.1 | 0.1 | 0.1 | 0.1 | 0.6 | 0.7 | 0.7 | 0.1 |
| | | C-3 | 0.1 | 0.1 | 0.1 | 0.1 | 0.1 | 0.1 | | | | 0.1 |
| | | C-4 | 0.1 | 0.1 | 0.1 | 0.1 | 0.1 | 0.1 | | | | 0.1 |
| | (D) | D-1 | 1.7 | 3.5 | 5.2 | | | | | | | |
| | | D-2 | | | | 1.7 | 3.5 | 5.2 | | | | |
| | (D') | D'-1 | 3.5 | 1.7 | | 3.5 | 1.7 | | 4.8 | 5.0 | 5.9 | 5.2 |
| | (E) | Silica particles | 17.5 | 17.5 | 17.5 | 17.5 | 17.5 | 17.5 | 12.9 | 13.2 | 13.5 | 17.5 |
| | | Barium sulfate particles | 13.1 | 13.1 | 13.1 | 13.1 | 13.1 | 13.1 | 16.2 | 16.6 | 16.8 | 13.1 |
| | (F) | Phthalocyanine pigment | 1.3 | 1.3 | 1.3 | 1.3 | 1.3 | 1.3 | 1.2 | 1.2 | 1.3 | 1.3 |
| | (G) | IXEPLAS-A2 | 0.4 | 0.4 | 0.4 | 0.4 | 0.4 | 0.4 | | | | 0.4 |
| | (H) | PB-3600 | 4.4 | 4.4 | 4.4 | 4.4 | 4.4 | 4.4 | | | | 4.4 |
| | | SP1108 | 8.7 | 8.7 | 8.7 | 8.7 | 8.7 | 8.7 | | | | 8.7 |
| | | Espel 1612 | | | | | | | 10.5 | | | |
| | | Espel 1620 | | | | | | | | 10.8 | | |
| | | XER-91 | | | | | | | | | 4.2 | |
| Evaluation results | | Resolution | A | A | A | A | A | A | B | B | C | A |
| | | Shape of resist pattern | A | A | A | A | A | A | B | B | B | A |
| | | Thermal shock resistance | A | A | A | A | B | B | C | B | C | B |
| | | Heat resistance | A | A | A | A | A | B | C | C | C | B |
| | | Insulating properties | A | A | A | A | A | A | C | C | C | A |
| | | Degree of elongation | A | A | A | A | A | A | C | B | C | B |
| | | Tensile strength | A | A | A | A | A | A | C | C | C | B |

The following are details of the materials shown in Table 1.

[Component (A): Photopolymerizable Compound Having an Ethylenically Unsaturated Group and an Acid Substituent]

A-1: the acid-modified ethylenically unsaturated group-containing epoxy derivative (A-1) obtained in Synthesis Example 1

A-2: the acid-modified ethylenically unsaturated group-containing epoxy derivative (A-2) obtained in Synthesis Example 2

A-3: the acid-modified ethylenically unsaturated group-containing epoxy derivative (A-3) obtained in Synthesis Example 3

[Component (B): Curing Agent]

YSLV-80XY: tetramethyl-bisphenol F epoxy resin (crystalline bisphenol epoxy resin) (trade name, manufactured by NIPPON STEEL Chemical & Material Co., Ltd.)

RE-306: polyfunctional novolac epoxy resin (trade name, manufactured by Nippon Kayaku Co., Ltd.)

jER828: bisphenol A epoxy resin (liquid epoxy resin) (trade name, manufactured by Mitsubishi Chemical Corporation)

[Component (C): Photopolymerization Initiator]

TABLE 1-continued

| | Example | | | | | | Comp. Example | | | |
|---|---|---|---|---|---|---|---|---|---|---|
| Component | 1 | 2 | 3 | 4 | 5 | 6 | 1 | 2 | 3 | 4 |

C-1: 2-methyl-[4-(methylthio)phenyl]morpholino-1-propanone
C-2: 2,4-diethylthioxanthone
C-3: 4,4'-bis(diethylamino)benzophenone
C-4: ethanone 1-[9-ethyl-6-(2-methylbenzoyl)-9H-carbazol-3-yl]-1-(0-acetyloxime)
[Component (D): Photopolymerizable Compound]
D-1: a compound represented by the following formula (D-5):

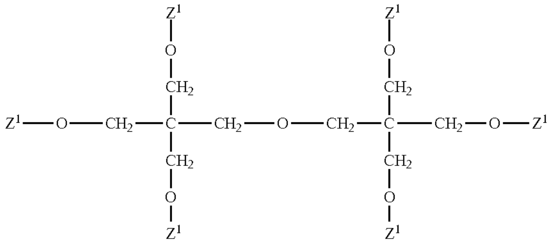

(D-5)

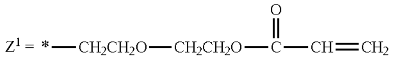

(D-5')

where $Z^1$ in the formula (D-5) is the group $Z^1$ represented by the formula (D-5'), and * in the formula (D-5') is a bonding site to an oxygen atom bonded to $Z^1$ in the formula (D-5').
D-2: a compound represented by the following formula (D-6):

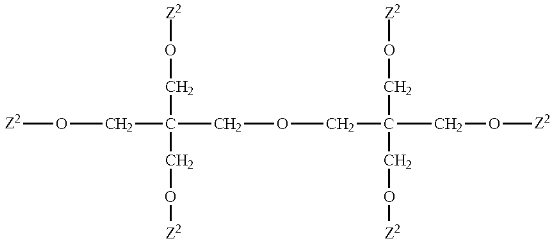

(D-6)

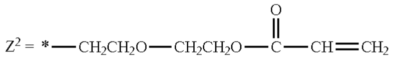

(D-6')

where $Z^2$ in the formula (D-6) is the group $Z^2$ represented by the formula (D-6'), and * in the formula (D-6') is a bonding site to an oxygen atom bonded to $Z^2$ in the formula (D-6').
[Component (D'): Photopolymerizable Compound Other Than Component (D)]
D'-1: dipentaerythritol hexaacrylate
[Component (E): Inorganic Filler]
Silica particles: trade name "SFP-20M", manufactured by Denka Company Limited, average particle size: 0.3 μm
Barium sulfate particles: trade name "B-34", manufactured by Sakai Chemical Corporation, average particle size: 0.3 μm
[Component (F): Pigment]
Phthalocyanine pigment: manufactured by Sanyo Color Works, Ltd.
[Component (G): Ion Scavenger]
IXEPLAS-A2: amphoteric scavenger containing Zr, Mg and Al (trade name, manufactured by Toagosei Co., Ltd., average particle size: 0.2 μm, content of Zr compound: 20 to 30 mass %)
[Component (H): Elastomer]
PB-3600: epoxylated polybutadiene (trade name, manufactured by Daicel Corporation)
SP1108: polyester resin (trade name, manufactured by Hitachi Chemical Co., Ltd.)
Espel 1612: polyester elastomer (trade name, manufactured by Hitachi Chemical Co., Ltd.)
Espel 1620: polyester elastomer (trade name, manufactured by Hitachi Chemical Co., Ltd.)
XER-91: crosslinked acrylonitrile butadiene rubber (trade name, manufactured by JSR Corporation)

The data in Table 1 indicates that the photosensitive resin compositions of Examples 1 to 6 according to this embodiment are excellent in the resolution, have flexibility with a high degree of elongation and have a high tensile strength against an external stress, and are excellent in the heat resistance, the thermal shock resistance, and the insulating properties. On the other hand, the photosensitive resin compositions of Comparative Examples 1 to 4 are inferior in some of the properties.

The invention claimed is:

1. A photosensitive resin composition comprising (A) a photopolymerizable compound having an ethylenically unsaturated group and an acid substituent, (B) a curing agent, (C) a photopolymerization initiator, and (D) a photopolymerizable compound, wherein the photopolymerizable compound (D) is a polyfunctional monomer which has a skeleton (X) derived from a polyhydric alcohol and having three or more bonding groups (a), each bonded to another structure and corresponding to a hydroxy group from which the hydrogen atom has been removed, and which has three or more (meth)acryloyl groups bonded directly or indirectly to the bonding groups (a), and wherein at least one (meth)acryloyl group of the three or more (meth)acryloyl groups is bonded to the bonding group(s) (a) via a linking group.

2. The photosensitive resin composition according to claim 1, wherein the linking group is a divalent group comprising an alkylene oxide structural unit, or a divalent group derived from a hydroxy acid.

3. The photosensitive resin composition according to claim 2, wherein the alkylene oxide structural unit is an alkylene oxide structural unit having 2 to 4 carbon atoms, and the hydroxy acid is an aliphatic hydroxy acid having 2 to 10 carbon atoms.

4. A dry film comprising a carrier film and a photosensitive layer using a photosensitive resin composition comprising:

(A) a photopolymerizable compound having an ethylenically unsaturated group and an acid substituent, (B) a curing agent, (C) a photopolymerization initiator, and (D) a photopolymerizable compound, wherein the photopolymerizable compound (D) is a polyfunctional monomer which has a skeleton (X) derived from a polyhydric alcohol and having three or more bonding groups (a), each bonded to another structure and corresponding to a hydroxy group from which the hydrogen atom has been removed, and which has three or more (meth)acryloyl groups bonded directly or indirectly to the bonding groups (a), wherein at least one (meth)acryloyl group of the three or more (meth)acryloyl groups is bonded to the bonding group(s) (a) via a linking group, and wherein the linking group is a divalent group comprising an alkylene oxide structural unit having 2 to 4 carbon atoms.

5. The dry film according to claim 4, wherein the skeleton (X) is a skeleton derived from a polyhydric alcohol selected from the group consisting of glycerin, diglycerin, trimethylolpropane, ditrimethylolpropane, pentaerythritol and dipentaerythritol.

6. The dry film according to claim 4, wherein, in the photopolymerizable compound (D), the number of the (meth)acryloyl groups, bonded to the bonding groups (a) via the linking group, is 3 to 10.

7. The dry film according to claim 4, wherein the photopolymerizable compound (A) having an ethylenically unsaturated group and an acid substituent is an acid-modified ethylenically unsaturated group-containing epoxy derivative obtained by reacting a resin (A'), which has been obtained by reacting an epoxy resin (a) and an ethylenically unsaturated group-containing organic acid (b), with a saturated or unsaturated group-containing polybasic acid anhydride (c).

8. The dry film according to claim 7, wherein the epoxy resin (a2) is at least one selected from the group consisting of a novolac epoxy resin different from the bisphenol novolac epoxy resin (a1), a bisphenol A epoxy resin, a bisphenol F epoxy resin, a triphenol methane epoxy resin, and a biphenyl epoxy resin.

9. The dry film according to claim 7, wherein the photopolymerizable compound (A) having an ethylenically unsaturated group and an acid substituent comprises a photopolymerizable compound (A1) having an ethylenically unsaturated group and an acid substituent, obtained by using a bisphenol novolac epoxy resin (a1) as the epoxy resin (a), and a photopolymerizable compound (A2) having an ethylenically unsaturated group and an acid substituent, obtained by using an epoxy resin (a2), which differs from the bisphenol novolac epoxy resin (a1), as the component (a).

10. The dry film according to claim 4, wherein the photopolymerization initiator (C) is at least one selected from the group consisting of an alkylphenone photopolymerization initiator, a thioxanthone photopolymerization initiator having a thioxanthone skeleton, a benzophenone photopolymerization initiator, an oxime ester photopolymerization initiator, and an acylphosphine oxide photopolymerization initiator.

11. The dry film according to claim 4, wherein the photosensitive resin composition further comprises (E) an inorganic filler.

12. The dry film according to claim 4, wherein the content of the photopolymerizable compound (A) having an ethylenically unsaturated group and an acid substituent, the content of the curing agent (B), the content of the photopolymerization initiator (C), and the content of the photopolymerizable compound (D) are 20 to 80% by mass, 2 to 40% by mass, 0.2 to 15% by mass, and 1 to 15% by mass, respectively, based on the total solid content of the photosensitive resin composition.

13. A printed wiring board having a surface protective film or an interlayer insulating layer formed from the photosensitive resin composition according to claim 1.

14. The printed wiring board according to claim 13, wherein the surface protective film or the interlayer insulating layer has a thickness of 5 μm or more.

15. A method for producing a printed wiring board, comprising the sequential steps of: providing a photosensitive layer on a substrate by using the photosensitive resin composition according to claim 1 or the dry film according to claim 4; forming a resist pattern by using the photosensitive layer; and curing the resist pattern to form a surface protective film or an interlayer insulating layer.

16. A method for producing a printed wiring board, comprising the sequential steps of: providing a photosensitive layer on a substrate by using the dry film according to claim 4; forming a resist pattern by using the photosensitive layer; and curing the resist pattern to form a surface protective film or an interlayer insulating layer.

* * * * *